(12) United States Patent
Kasuga et al.

(10) Patent No.: US 6,664,647 B2
(45) Date of Patent: Dec. 16, 2003

(54) SEMICONDUCTOR DEVICE AND A METHOD OF MANUFACTURING THE SAME

(76) Inventors: Takahiro Kasuga, c/o Hitachi Hokkai Semiconductor, Ltd. 145, Aza Nakajima, Nanaecho, Kameda-gun, Hokkaido 041-1196 (JP); Seiichi Tomihara, c/o Hitachi Hokkai Semiconductor, Ltd. 145, Aza Nakajima, Nanaecho, Kameda-gun, Hokkaido 041-1196 (JP); Kazuo Tasaka, c/o Hitachi Hokkai Semiconductor, Ltd. 145, Aza Nakajima, Nanaecho, Kameda-gun, Hokkaido 041-1196 (JP)

( * ) Notice: Subject to any disclaimer, the term of this patent is extended or adjusted under 35 U.S.C. 154(b) by 0 days.

(21) Appl. No.: 10/123,242

(22) Filed: Apr. 17, 2002

(65) Prior Publication Data

US 2002/0109242 A1 Aug. 15, 2002

Related U.S. Application Data

(62) Division of application No. 09/920,942, filed on Aug. 3, 2001, now abandoned.

(30) Foreign Application Priority Data

Aug. 18, 2000 (JP) ......................................... 2000-248744

(51) Int. Cl.[7] ............................................... H01L 23/28

(52) U.S. Cl. ...................................... 257/787; 257/666

(58) Field of Search ................................. 257/666, 787, 257/670, 667

(56) References Cited

U.S. PATENT DOCUMENTS

| 4,894,704 A | | 1/1990 | Endo ........................... 257/667 |
| 5,645,864 A | * | 7/1997 | Higuchi |
| 5,684,327 A | | 11/1997 | Nakazawa et al. ........... 257/667 |
| 5,750,153 A | * | 5/1998 | Shibata |
| 5,753,532 A | | 5/1998 | Sim ............................ 438/112 |
| 5,977,613 A | * | 11/1999 | Takata et al. |
| 6,028,774 A | * | 2/2000 | Shin et al. |
| 6,238,953 B1 | | 5/2001 | Tanaka et al. ............... 438/112 |
| 6,399,423 B2 | * | 6/2002 | Matsuura et al. |
| 6,469,369 B1 | | 10/2002 | Lee ............................. 257/670 |

FOREIGN PATENT DOCUMENTS

| JP | 5-299455 | 11/1993 |
| JP | 5-326799 | 12/1993 |
| JP | 2000-61989 | 2/2000 |

* cited by examiner

*Primary Examiner*—Sheila V. Clark

(57) ABSTRACT

Upon the manufacture of a non-leaded type semiconductor device having an encapsulater, and a gate cured resin and air vent cured resins which remain as a result of the exposure of leads and tub-suspension leads to a mounting surface of the encapsulater and the formation of the encapsulater, a groove through which a resin flows is not provided over the full circumference of a cavity defined in a mold die for forming the encapsulater. A gate and air vents are provided outside an area in which no groove is defined. The flow of the resin between the cavity and each of the gate and air vents is made through a gap or space defined between each of the adjacent leads and each tub-suspension lead. If the leads and the tub-suspension leads are cut at a groove-free place, then the occurrence of resin waste and a resin crack can be restrained because the gate cured resin and the air vent cured resins have their surfaces which are flat and level with the leads and the tub-suspension leads.

6 Claims, 26 Drawing Sheets

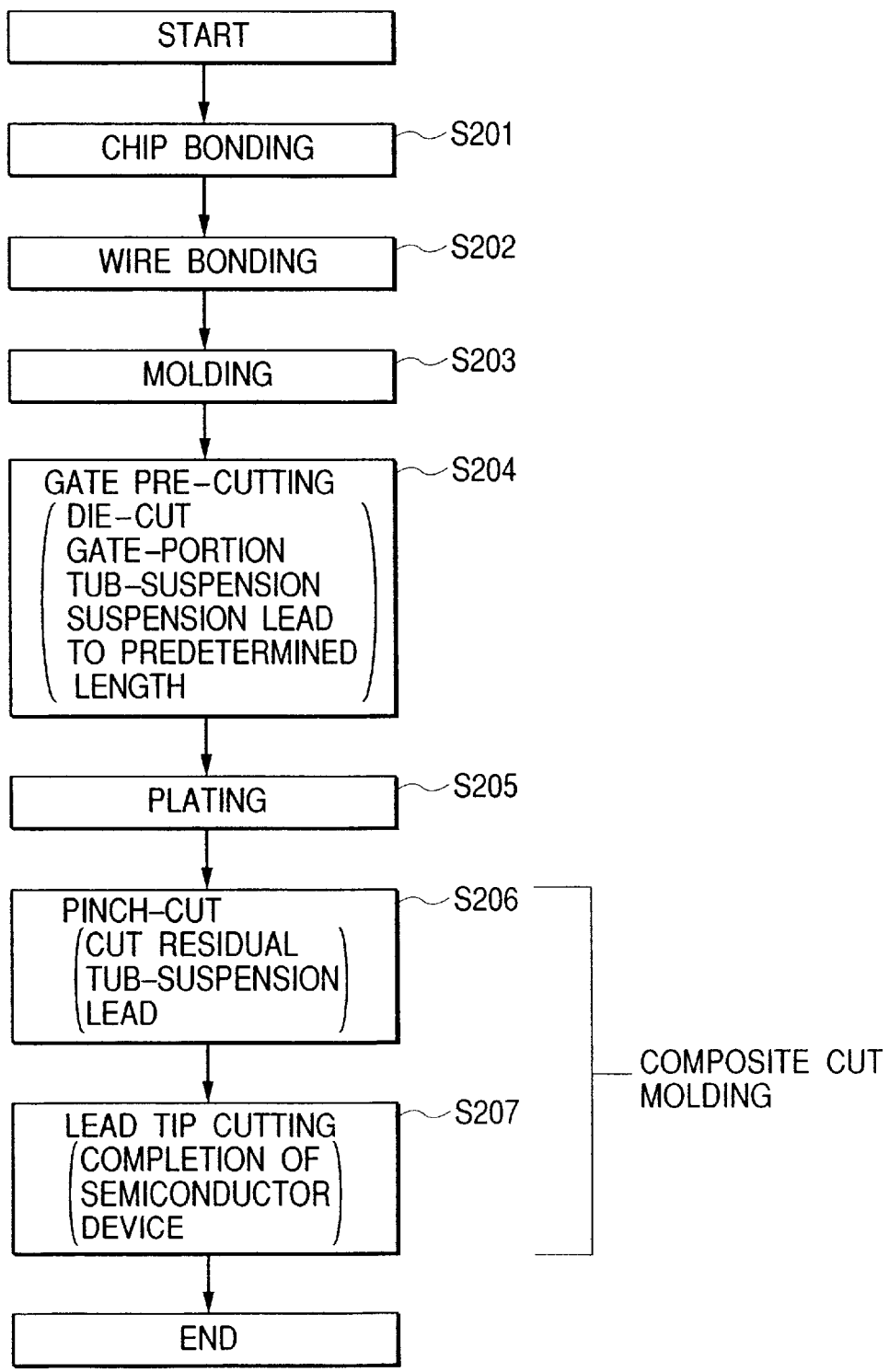

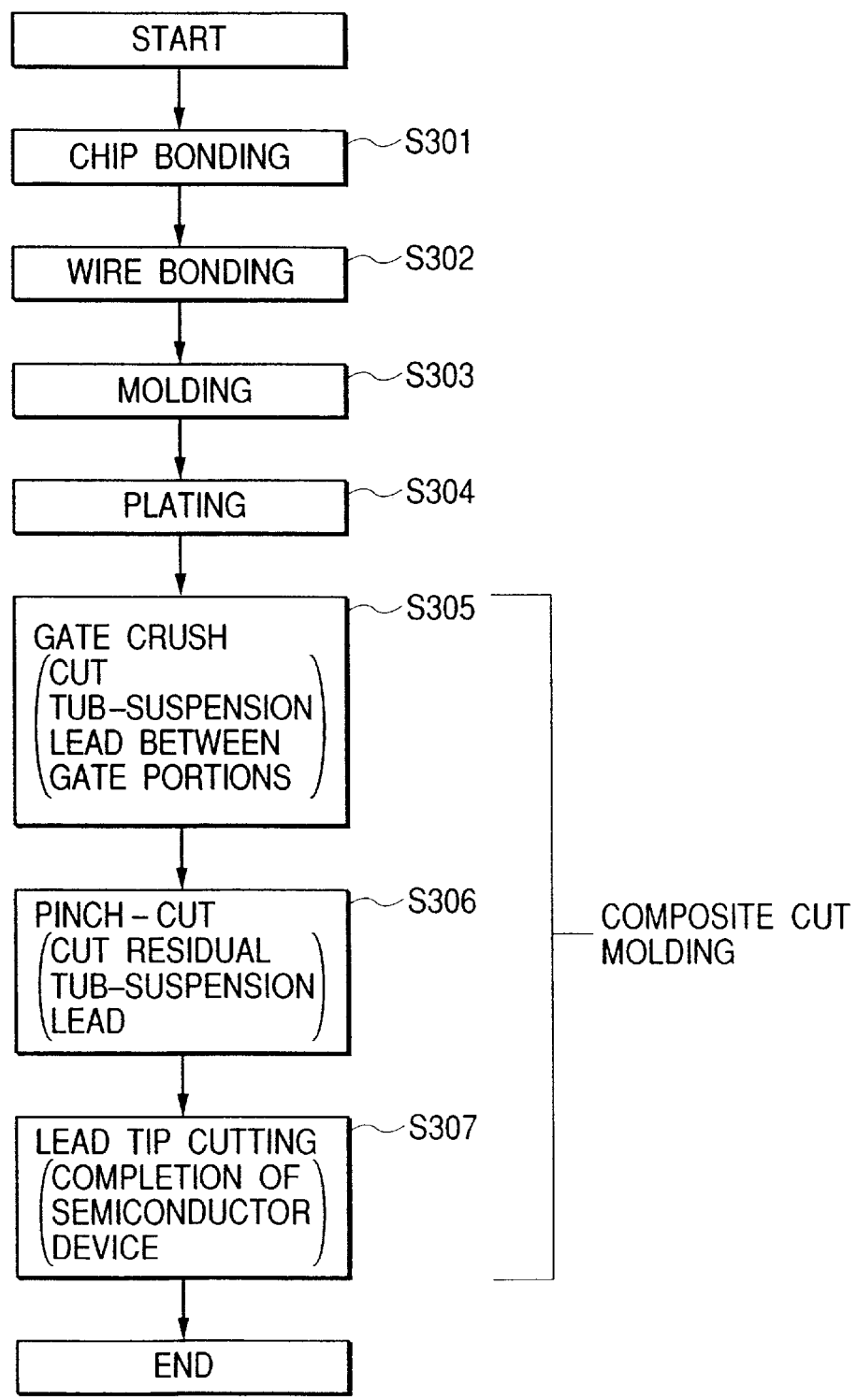

SEMICONDUCTOR DEVICE AND A METHOD OF MANUFACTURING THE SAME

CROSS-REFERENCE TO RELATED APPLICATION

This application is a division of application Ser. No. 09/920,942 filed Aug. 3, 2001 now abandoned.

FIELD OF THE INVENTION

The present invention relates to a technology for manufacturing a resin molded or encapsulation type semiconductor device using a lead frame, and particularly to a technology effective for application to the manufacture of a semiconductor device wherein external electrode terminals (leads) are exposed to the mounting surface side as in an SON (Small Outline Non-Leaded Package) and a QFN (Quad Flat Non-Leaded Package).

BACKGROUND OF THE INVENTION

A resin encapsulation type semiconductor device makes use of a lead frame upon its manufacture. The lead frame is fabricated by forming a metal plate as a desired pattern by punching using a precision press or etching. The lead frame has a support portion called a "tub or the like" for fixing a semiconductor chip, and a plurality of leads whose leading ends (internal ends) face the periphery of the support portion. The tub is supported by tub-suspension leads which extend from a frame portion of the lead frame.

When the resin encapsulation type semiconductor device is fabricated through the use of such a lead frame, the semiconductor chip is fixed to the tub of the lead frame, and electrodes of the semiconductor chip and leading ends of the leads are connected to one another by conductive wires. Afterwards, the lead internal-end side including the wires and the semiconductor chip is sealed with an insulating resin to thereby form an encapsulater (package). Further, an unnecessary lead frame portion is removed by cutting, and the leads and tub-suspension leads protruding from the package are cut. Each of the leads is brought to a flat state or processed into a predetermined shape.

As technologies for solving a problem as to a transfer mold for forming a resin encapsulation package, there are known technologies described in Unexamined Patent Publication Nos. Hei 5(1993)-326799, 2000-61989 and Hei 5(1993)-299455, for example.

Although a resin injection hole (gate) is not illustrated in the drawing in the above technologies, the prior art set forth as a premise has described that the resin injection hole is provided in a lower mold. Accordingly, a resin (called "gate cured resin") cured at a gate portion extends on one surface side of a lead frame so as to have a predetermined height.

Unexamined Patent Publication No. 2000-61989 has disclosed the technology of separating a runner from a molded plastic package with being flush with the package upon a transfer mold process. Namely, a transfer mold die has a movable gate lowered so as to make contact with the plastic package formed at a resin inlet for the cavity on the same plane as the plastic package before the resin is cured after having been injected in the cavity. Accordingly, the runner can be cut on a flush basis with the plastic package.

The same reference has described that when the resin cured within the runner is removed, the resin cured at the runner portion remains at each edge of the plastic package, and a bottleneck is produced in the subsequent lead formation and trimming process due to such a remainder. Problems will be quoted from the same reference and described below.

(1) Damage is put on the trimming of each lead and the formation of a die, and manufacturing yields and a production throughput are reduced. It is necessary to repair or fix up an expensive die.

(2) There is a possibility that upon lead trimming and forming processes, the plastic package will be peeled off from the lead frame, thereby causing a problem about the reliability of a completed product.

(3) The adhesion of the remainder or remaining materials to the plastic package as it is will lead to a serious result. Described typically, a check is made to respective packages and all the remaining materials are manually removed. Therefore, personnel costs increase and a manufacturing throughput is reduced.

According to the present technology, runner's fragments are not left behind with being attached to the plastic package even after the transfer mold. Further, the runner can be detached from the molded lead frame. Thus the work of manually removing the remainder becomes unnecessary. It is also possible to avoid damage to the trimming of each lead and a lead forming instrument due to the remainder as well as to avoid damage to a packaged semiconductor device.

The present technology shows the technical idea that since the remainder of the resin produces a bottleneck in the trimming process such as the bending of each lead, the occurrence of the remainder in the lead frame is avoided even after the removal of the runner. The present technology has no description about the cutting of leads at a gate portion, i.e., a basal portion of the package and makes little mention of such a problem.

Unexamined Patent Publication No. Hei 5(1993)-299455 describes the technology of thinning a gate in stepped form in advance at a base of a resin encapsulated portion so that when a resin portion cured at a gate portion for forming the resin molded portion is separated from a package, a gate residual is not much left on a placed piece or fragment, and causing a gate cured resin to remain on the placed piece thinner or shorter upon removal of the gate cured resin.

The present technology does not show the idea of cutting a placed-fragment portion causing the remainder of the gate.

On the other hand, as one resin encapsulation type semiconductor device fabricated using a lead frame, there is known a non-leaded type semiconductor device such as an SON, a QFN or the like adopted or taken as a semiconductor device structure wherein one surface of the lead frame is single-sided molded to thereby form a package, and leads corresponding to external electrode terminals are exposed to the mounting surface side of the package, thereby avoiding the intentional protrusion of the leads from the peripheral surface of the package.

SUMMARY OF THE INVENTION

In terms of a size reduction in semiconductor device, the prevention of bending of leads corresponding to external electrode terminals, etc., a non-leaded type semiconductor device such as a single-sided molded SON or QFN has been used.

Since the outer shape of the non-leaded type semiconductor device is principally determined depending on a resin encapsulater (package) and a lead cutting castle or castled extension formed on its periphery, the semiconductor device can be reduced in size as compared with a semiconductor device of such a type that leads are placed on the periphery of a package, generally called a "QFP (Quad Flat Package)" or an SOP (Small Outline Package)". The lead cutting castle or castle extension is produced by ensuring an area for applying a die between a cutting-plane line and a package when the leads are cut by punches, and is formed with a width of about 0.1 mm in the embodiment of the present specification, for example.

Problems about the manufacture of the conventional single-sided molded non-leaded type semiconductor device will now be explained.

A description will first be made of one in which a resin encapsulater (package) is formed on one surface side of a lead frame by a transfer mold with the manufacture of QFN as an example.

FIG. 31 is a plan view showing a resin encapsulater formed by a transfer mold and a unit lead frame pattern. As shown in the same drawing, a lead frame 1 has a structure having a frame portion 2 shaped in the form of a rectangular frame, a plurality of leads 3 extending inwardly from inside the respective sides of the frame portion 2, and tub-suspension leads 4 (only one tub-suspension lead is shown in the drawing) which respectively extend inwardly of the frame portion from the four corners of the frame portion 2 and support a central tub (not shown). A resin encapsulater (package) 5 is formed in a central portion of a unit lead frame pattern 6, and leading end portions (internal end portions) of the respective leads 3 extend within the package 5. Lower surfaces of the leads 3 are exposed from the package 5. The exposed lead portions serve as external electrode terminals for surface mounting when a semiconductor device is brought about.

Although not illustrated in the drawing, a semiconductor chip fixed onto the tub is placed within the package 5. Further, electrodes of the semiconductor chip and inner ends of the leads 3 are electrically connected to one another by conductive wires.

Upon a transfer mold, a gate (G) is located in one corner (corresponding to the upper right corner in FIG. 31) of the lead frame 1. A resin is injected into a cavity of a mold die through the gate to thereby form the corresponding package 5. At this time, air lying within the cavity escapes from air vents (E) located in the remaining three corners of the lead frame 1 to the outside of the mold die. Thus, the resin enters even the gate and the air vents and hence the resin at these portions is also cured by resin's curing. The resin cured at the gate portion will be referred to as a "gate cured resin 7" below. The resins cured at the air vent portions will be called "air vent cured resins 9".

The package 5 shaped in rectangular form is generally chamfered as shown in FIG. 31 to have slopes B in such a way as to avoid the presence of cornered portions (corners). The slopes 8 are large in gate portion and small in air vent portions.

After the transfer mold, the resin cured inside each runner for guiding the resin is removed when the curing of the resin is finished. FIG. 31 shows a state in which a runner cured resin or the like is removed and is a diagram showing that the gate cured resin 7 and the air vent cured resins 9 remain.

FIG. 32 is a side view typically showing the lead frame 1, package 5, air vent cured resins 9, runner cured resin 10 and gate cured resin 7. FIG. 33 is a typical cross-sectional view showing the lead frame 1, tub-suspension leads 4, package 5 and gate cured resin 7 or the like. As shown in FIG. 32, the resin cured at the gate portion upon removal of the runner cured resin 10 is formed integrally with the package 5. Therefore, the resin will break in the course thereof and a gate cured resin 7 of a chevron or mounting type as viewed from the side remains. Namely, as the gate cured resin 7 is kept away from the package 5, the thickness thereof becomes thick and its leading end is brought to a broken state.

Thus, even when the gate cured resin 7 is set to such a shape that its thickness becomes thick as it is distant from the package, and is designed in such a manner that the gate cure resin is preferably broken in the vicinity of the package upon breakage and removal of the gate cured resin, the gate cured resin cannot be prevented perfectly from remaining, and the size and shape of the produced remaining cured resin are made in various ways.

As shown in FIG. 33, the cured resins remain on both sides of the tub-suspension lead 4 as indicated by dots. Namely, upon the transfer mold, spaces defined by parting surfaces of upper and lower molds of a mold die and the tub-suspension lead 4 and leads 3 adjacent thereto both located at the gate portion are formed as spaces which communicate with the gate. The cured resins having entered the spaces correspond to the cured resin portions indicted by the dots. These cured resin portions are generally called resin burrs 11. The thickness of each resin burr 11 is identical to that of each lead 3 in a state in which the parting surfaces of the upper and lower molds of the mold die are closely bonded to the obverse and reverse sides of the lead frame.

However, when a gap is defined between each of the parting surfaces and the lead frame where the above package is clamped between the parting surfaces of the upper and lower molds of the mold die and the lead frame, the resin enters into the gap and so-called resin flashes occur in each lead surface or the like. In the resin-flash generated state, the thickness of each resin burr 11 becomes thicker than that of each lead.

After the transfer mold, the leads 3 and tub-suspension leads 4 both protruding from the periphery of the package are cut at the peripheral edge of the package 5, whereby the corresponding non-leaded type semiconductor device (QFN) is manufactured. When, at this time, the sizes of the gate cured resin 7 and each air vent cured resin 9 are too large to accommodate or hold them in the lead cutting castle, the gate cured resin 7 and the air vent cured resins 9 are also cut upon lead cutting.

FIG. 34 is a typical view showing the situation in which a gate cured resin 7 and air vent cured resins 9 are cut by a die 15 and punches 16 together with each tub-suspension lead 4. The cutting of leads 3 is also carried out by a die and punches each having a similar structure.

However, when the gate cured resin 7 remains at one side of a package as shown in FIG. 34, it is essential that the gate cured resin 7 is cut while the die 15 is being applied to the mounting surface side contrary to the normal lead cutting. This is because since the flatness of each lead surface on the package side is lost due to the presence of the gate cured resins 7, and the remaining amounts thereof are all different, the die 15 cannot be stably applied to each lead.

It turned out that since the gate cured resin 7 takes such a shape as to protrude toward its corresponding punch 16 as described above, the gate cured resin 7 firstly contacts the punch 16 and thereby stress is applied to the punch 16 upon cutting as shown in FIG. 35, whereby breakage, cracks and chipping are developed therein by stress concentration and resin waste is frequently produced.

It has been found that the resin waste 17 is spattered over the periphery and is thereby attached not only to other lead frame portions but also to surfaces related to the cutting of the die 15 and punches 16 and cut surfaces of the gate cured resin 7 and tub-suspension lead 4 as shown in FIG. 34. Namely, the resin waste is produced by (1) cutting away the resin in fine form when the punches are applied to the gate cured resins as described above and (2) rubbing the punches and their cut surfaces against each other when the punches are returned to their predetermined positions after their cutting. Further, the resin waste drops out even by vibrations at the carrying of a product, contaminates a cutting die and is re-attached to other product portions.

In the non-leaded type semiconductor device, there is a fear that since each lead surface exposed to the back of the package is brought to the external electrode terminal surface so as to serve as a mounting surface, an electrically-isolated state occurs in a mounted state when the insulative resin waste is attached or crimped to the surface, thereby interfering with a stable operation of the semiconductor device.

When the gate cured resin is much cracked upon its cutting, a crack enters even into the package, thereby causing a reduction in moisture resistance and degradation of reliability.

If a method of applying the die 15 to the mounting surface side of each lead with a cutting-plane line interposed therebetween and cutting the leads by the punches 16 from the side opposite to the mounting surface is adopted as shown in FIG. 34, then cut burrs occur in the mounting surface of each lead, thereby losing the flatness of the mounting surface and degrading reliability.

A non-leaded type semiconductor device has heretofore been fabricated according to a method shown by such a flowchart as shown in FIG. 36. The non-leaded type semiconductor device is manufactured via respective process steps of Steps 201 through 207. Namely, after the commencement of work, the semiconductor device is fabricated via the respective process steps of chip bonding (S201), wire bonding (S202), molding (S203), gate pre-cutting (S204), plating (S205), pinch-cut by composite cut molding (S206), and lead tip cutting (S207), and thereafter the work is finished.

In the present manufacturing method, the gate pre-cutting (S204) is carried out before the plating step, and each gate-portion tub-suspension lead is punched out to a predetermined length. Therefore, even if resin waste occurs, the resin waste is removed by cleaning corresponding to processing subsequent to the plating. Thus, a problem about the above-described resin waste little arises.

However, the present manufacturing method is accompanied by a drawback that as a cutting process executed by a press machine, the gate pre-cutting (S204), the pinch-cut (S206) by composite cut molding, and the lead tip cutting (S207) are carried out twice, thereby increasing the manufacturing cost of a semiconductor device.

Thus the present applicant adopts a manufacturing method of achieving a reduction in manufacturing cost with the press machine-based cutting process as one. FIG. 37 is a flowchart using the present manufacturing method.

A non-leaded type semiconductor device is manufactured via respective process steps of Steps 301 through 307. Namely, after the commencement of work, the semiconductor device is fabricated via the respective process steps of chip bonding (S301), wire bonding (S302), molding (S303), plating (S304), gate crush by composite cut molding (S305), pinch-cut (S306) and lead tip cutting (S307), and thereafter the work is completed.

A composite cut mold is attached to one press machine. Under intermittent motion of a lead frame and a cutting operation based on composite cut molding, the cutting (corresponding to the gate crush for cutting one point in linear form) of a gate portion and tub-suspension leads thereof, pinch-cutting for cutting remaining tub-suspension leads used to support a package, and lead tip cutting for cutting all the leads at the basal portion of the package are executed to complete a semiconductor device, and thereafter the work is finished.

FIGS. 38(a) and 38(b) are respectively typical views showing a gate crush operation. In a manufacturing method using gate crush, processing is done in a state in which a package 5 is placed on a lower surface of a lead frame 1.

Namely, a die 15 is placed on the upper side of the lead frame 1. A punch 16 goes up from its lower side to cut a gate cured resin 7 and each tub-suspension lead 4 extending together with the gate cured resin 7. The punch 16 serves like a knife edge without having a structure for cutting them to a predetermined length and simply cuts the gate cured resin 7 and each tub-suspension lead 4. The tub-suspension lead 4 is bent as shown in FIG. 38(a) under the post-cut moving operation of the punch 16. Resin waste 17 is produced even upon the cutting of the gate cured resin 7 and the tub-suspension lead 4.

Owing to the execution of such gate crush processing, the cutting of the gate cured resin and each tub-suspension lead thereat at pinch-cutting (S306) become unnecessary, and the produced amount of resin waste can be reduced. An advantage is brought about in that it is possible to reduce a resin crack produced in the gate portion and a cut failure in tub-suspension lead.

However, it has been found that in the case of the present gate crush, the cut resin surface and the die are rubbed against each other when the cut type (die) is opened as shown in FIG. 38(b), so that resin waste is spattered, thereby causing adhesion to each lead surface. An arrow in FIG. 38(b) is used to indicate the situation in which the resin waste 17 is spattered upon die opening to thereby adhere onto each lead (while the lead corresponds to the tub-suspension lead in the drawing, unillustrated leads are also arranged on this surface of the package 5).

An object of the present invention is to provide a technology wherein when a gate cured resin and air vent cured resins are cut upon the manufacture of a non-leaded type semiconductor device fabricated by a single-sided mold, resin waste is restrained from occurring to thereby prevent the attachment of the resin waste to external electrode terminals.

Another object of the present invention is to provide a technology wherein when a gate cured resin and air vent cured resins are cut upon the manufacture of a non-leaded type semiconductor device fabricated by a single-sided mold, a resin crack is retrained from occurring to thereby prevent a reduction in moisture resistance of the semiconductor device and the occurrence of a failure in outward appearance thereof.

The above, other objects and novel features of the present invention will become apparent from the description of the present specification and the accompanying drawings.

Summaries of typical ones of the inventions disclosed in the present application will be described in brief as follows:

(1) There is provided a semiconductor device which has an encapsulater comprising an insulating resin, leads and tub-suspension leads exposed to a mounting surface of said encapsulater and a gate cured resin and air vent cured resins which remain as a result to form said encapsulater, and wherein each of the gate cured resin and the air vent cured resins exists in a portion between each tub-suspension lead and each lead with a thickness identical to or smaller than the thickness of each of resin burrs.

Such a semiconductor device is manufactured by the following manufacturing method.

There is provided a method of manufacturing a semiconductor device, comprising a step for preparing a lead frame having a frame portion, a plurality of leads which protrude inwardly of the frame portion from the frame portion, and a plurality of tub-suspension leads which protrude inwardly of the frame portion from the frame portion and support a tub at leading end portions thereof; a step for fixing a semiconductor chip to one surface of the tub; a step for electrically connecting electrodes of the semiconductor chip and the leads; a step for covering the semiconductor chip and the leads with an encapsulater comprising an insulating resin and exposing the leads and the tub-suspension leads to a mounting surface of the encapsulater; and a step for cutting the leads and the tub-suspension leads; and wherein a vertical space defined by only the sides of the leads and the tub-suspension leads is used as a resin flow path to form the encapsulater, and the leads and the tub-suspension leads are cut at a resin portion cured in the vertical space defined by only the sides of the leads and the tub-suspension leads.

Further, a gate provided in a mold die is provided outside the vertical space defined by only the sides of the leads and the tub-suspension leads, and a resin passes through the gate and flows through the vertical space to thereby form the encapsulater. In addition, air vents defined in the mold die are provided outside the vertical space defined by only the sides of the leads and the tub-suspension leads, and the resin passes through the vertical space and goes through the air vents.

According to the means of (1) referred to above, (a) The cutting of leads and tub-suspension leads that protrude from the periphery of an encapsulater (package), and the cutting of gate cured resins and air vent cured resins produced upon the formation of the package are performed at portions respectively identical in thickness and whose front and back are flat. Thus, they can be cut by punches and a die without partly applying an on-cutting stress on the gate cured resins and air vent cured resins in a large way. It is therefore possible to reduce the occurrence of resin waste to a large extent as compared with the conventional cutting method and restrain the occurrence of a resin crack.

(b) Since the resin waste can be restrained from occurring, the attachment and crimping of the resin waste to lead surfaces serving as external electrode terminals due to the spattering of the resin waste, and the occurrence of flaws caused by the crimping can be restrained. It is also possible to ensure solderability at mounting and enhance mounting yields. Furthermore, the reliability of the mounting or implementation of a non-leaded type semiconductor device can be improved.

(c) Since a matrix type lead frame takes a structure wherein unit lead frame patterns are vertically and horizontally arranged in line, the prevention of the spattering of the resin waste results in the prevention of contamination of the resin waste on each unit lead frame pattern around a predetermined unit lead frame pattern, whereby production yields can be improved to a great extent.

(d) Since the occurrence of the resin waste can be restrained, the contamination caused by the cut-die's resin waste can be prevented from occurring, and the availability factor of a press machine for mounting a cut die can be improved.

(e) Since the gate cured resins and air vent cured resins around the package are rendered integral with resin burrs between adjacent leads or those between tub-suspension leads and leads and are identical to the resin burrs in obverse and reverse sides, it is difficult to visually confirm the gate cured resins and air vent cured resins on the periphery of the package of the non-leaded type semiconductor device. Thus, the semiconductor device is look good and preferable even in outer appearance, and increases in commodity property.

(f) The manufacturing cost of a semiconductor device can be reduced in terms of productivity and an improvement in yield.

BRIEF DESCRIPTION OF THE DRAWINGS

FIG. 17 is a typical plan view showing a cutting die for cutting the gate cured resin or the like;

FIG. 18 is a typical cross-sectional view depicting the cutting die for cutting the gate cured resin or the like:

FIG. 36 is a flowchart for describing a method of manufacturing a conventional non-leaded type semiconductor device;

FIG. 37 is a flowchart for describing a method of manufacturing a non-leaded type semiconductor device including a gate crush process step.

DESCRIPTION OF THE PREFERRED EMBODIMENTS

Figure 1A:
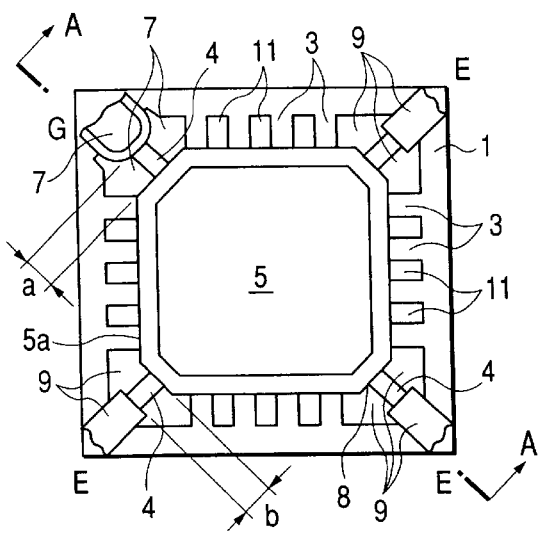
FIG. 1(a) is a typical plan view.

Preferred embodiments of the present invention will hereinafter be described in detail with reference to the accompanying drawings. Incidentally, ones each having the same function are respectively identified by the same reference numerals in all the drawings for describing the embodiments of the present invention, and their repetitive description will therefore be omitted.

First Embodiment

FIGS. 1 through 24 are respectively diagrams related to a method of manufacturing a semiconductor device showing one embodiment (first embodiment) of the present invention.

Figure 2:
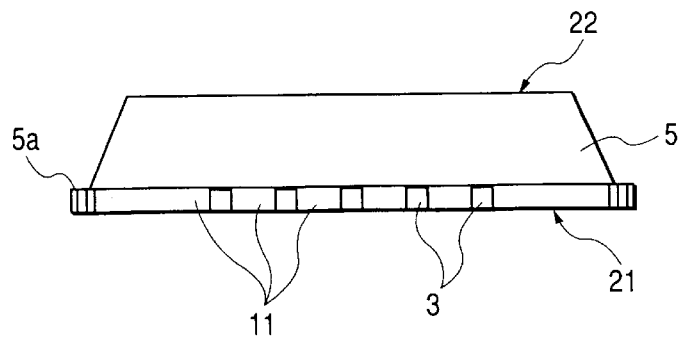
FIG. 2 is a front view illustrating the semiconductor device according to the first embodiment.

QFN showing one example of a non-leaded type semiconductor device manufactured by the method of manufacturing the semiconductor device showing the first embodiment will first be explained. FIG. 2 is a front view of the semiconductor device, FIG. 3 is a plan view thereof, FIG. 4 is a bottom view thereof, FIG. 5 is a cross-sectional view taken along line B—B of FIG. 3, and FIG. 6 is a cross-sectional view taken along line C—C of FIG. 3, respectively.

Figure 3:
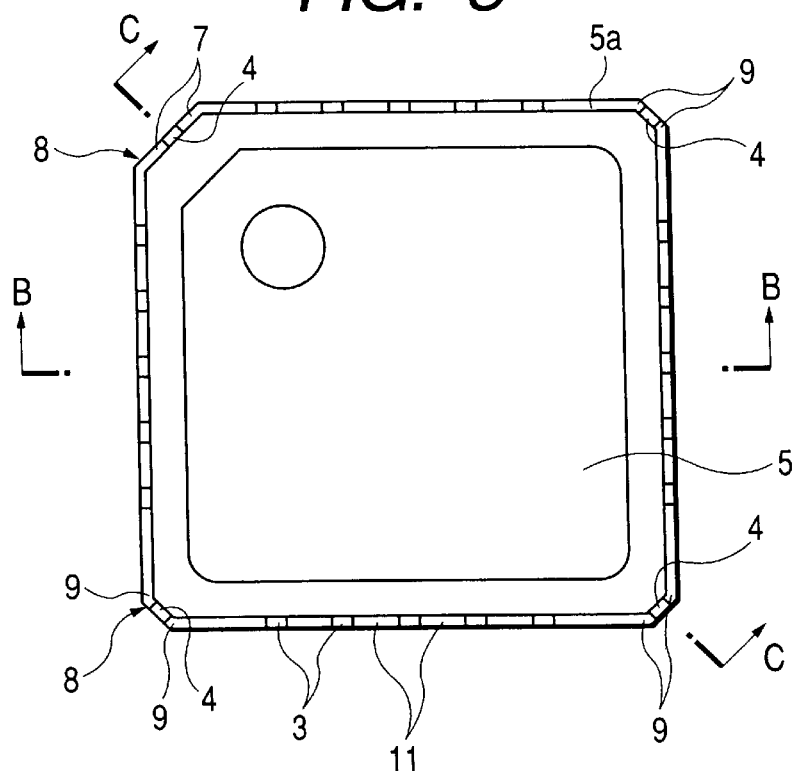
FIG. 3 is a plan view depicting the semiconductor device according to the first embodiment.
Figure 4:
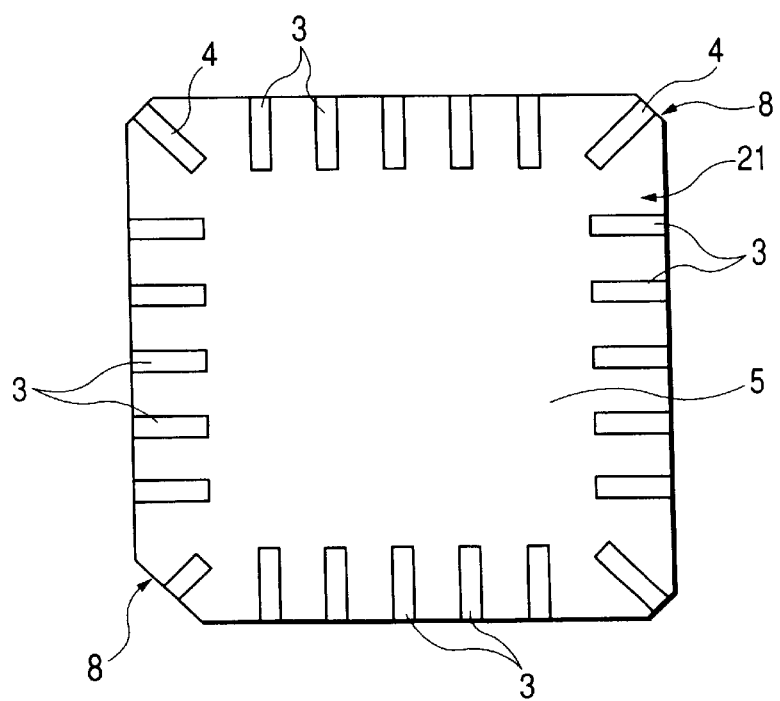
FIG. 4 is a bottom view showing the semiconductor device according to the first embodiment.

In the QFN type semiconductor device 20, a sealing body or encapsulater (insulating sealing body: package) 5 comprises a flat quadrangular or square body (rectangular body) as shown in FIGS. 2 through 4. Angular portions (corners) of the sealing body 5 is chamfered to form slopes 8. One of the slopes 8 is large and serves as a resin injection point or portion through which a resin is injected, upon formation of the package 5. Other three slopes 8 become small and serve as air vent portions from which air escapes upon formation of the package 5.

Figure 5:
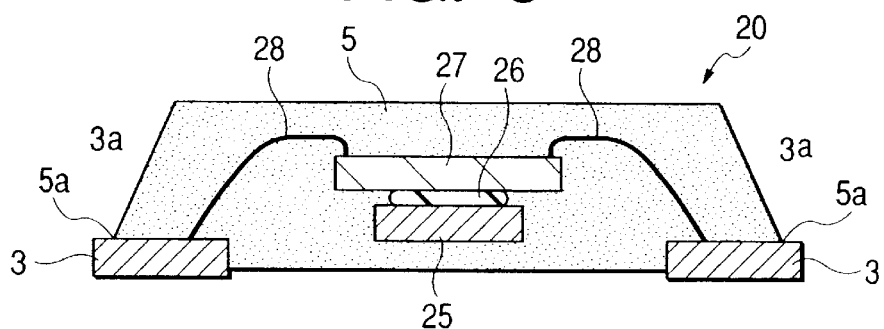
FIG. 5 is a cross-sectional view taken along line B—B of FIG. 3.
Figure 6:
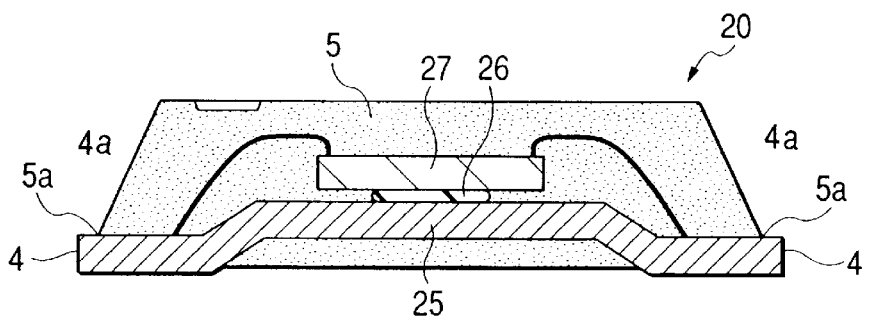
FIG. 6 is a cross-sectional view taken along line C—C of FIG. 3.

As shown in FIGS. 2, 5 and 6, the package 5 has sides which respectively serve as inclined surfaces formed so as to be easy to come off or escape from a mold die when the package 5 is formed by a transfer mold method. Accordingly, an upper surface 22 of the package 5 is smaller than the size of a mounting surface 21 formed as a lower surface even in the case of any of the drawings referred to above.

Leads 3 are exposed from the reverse side or back of the package 5, i.e., the peripheral edges of the mounting surface 21. The leads 3 are disposed at its respective sides at predetermined pitches, for example. The four corners of the package 5, i.e., tub-suspension leads 4 are exposed at or from the peripheral edges of the mounting surface 21, which are associated with the respective centers of the slopes 8.

As shown in FIGS. 5 and 6, the leads 3 and 4 slightly protrude outside from a rising edge 5a of the package 5 with respect to the surfaces of the leads 3 and tub-suspension leads 4, which are covered with the package 5, i.e., covered surfaces 3a and 4a. This serves as a receiving portion of a die upon cutting the leads 3 and the tub-suspension leads 4 and is less than or equal to 0.1 mm, for example. While resin burrs 11 exist between the respective leads 3 and between the tub-suspension leads 4 and the leads 3, the resin burrs 11 are also cut by the die and punch. Therefore, the edges of the resin burrs 11 and the leading edges or tips of the leads 3 and tub-suspension leads 4 are linearly formed without irregularities at the peripheral edge of the package 5.

On the other hand, when a transfer mold is used to form the package 5, the resin enters or pours into any of the resin injection portion and air vent portions, and they are cured upon a resin curing process, whereby a gate cured resin 7 and an air vent cured resin 9 are formed.

Figure 1B:
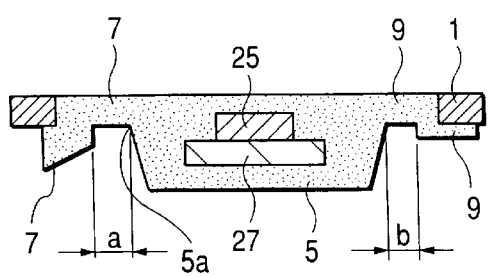
FIG. 1(b) a cross-sectional view taken along line A—A of FIG. 1(a), showing a lead frame portion single-sided molded by a method of manufacturing a semiconductor device according to one embodiment (first embodiment) of the present invention.

While the resin injection portion (gate: G) is described later in the semiconductor device manufacturing method in the first embodiment, it is formed by a space (equivalent to a vertical space corresponding to the lead 3 and the tub-suspension lead 4) between the tub-suspension lead 4 and the leads 3 disposed on both sides thereof over a predetermined length (a) at the edge portion of the package 5 as shown in FIGS. 1(a) and 1(b). This is defined as a space which does not extend out beyond the thickness of the tub-suspension lead 4 and that of the lead 3. Thus, the thickness of the resin cured at the gate portion having the length (a), i.e., the thickness of the gate cured resin 7 coincides with the thickness of the lead 3 or the tub-suspension lead 4 or smaller than that thereof. The thickness of the gate cured resin 7 becomes identical to that of each resin burr 11 formed between the adjacent leads 3. Therefore, the front and back sides thereof are both brought to flat surfaces respectively. Since the leads 3 and the tub-suspension leads 4 are cut within a region for the length (a), a trace of the gate cured resin 7 is not prominent as compared with the resin burrs 11 in the semiconductor device 20 of the first embodiment 1 while it is designated at reference numeral 7 in FIGS. 3 and 1(a).

Since, however, a gate groove or trench is provided outside the length (a) as a groove in the mold die, the gate cured resin 7 protrudes outside the length (a) beyond the thickness of the lead 3 in a state in which the lead frame 1 shown in FIGS. 1(a) and 1(b) is shown. The gate cured resin 7 takes such a shape as being placed on a frame portion. Taking such a shape makes it possible to sufficiently ensure the cross-sectional area of a gate.

In a manner similar to the gate portion even in the case of air vent portions (E), each air vent is formed by a space between the tub-suspension lead 4 and the leads 3 disposed on both sides thereof over a predetermined length (b) as viewed from the edge of the package 5. This is defined as a space which does not extend out beyond the thickness of the tub-suspension lead 4 and that of the lead 3. Thus, the thickness of the resin cured at the portion having the length (b), i.e., the thickness of the air vent cured resin 9 coincides with the thickness of the lead 3 or the tub-suspension lead 4 or smaller than that thereof. The thickness of the air vent cured resin 9 becomes identical to that of each resin burr 11 formed between the adjacent leads 3. Therefore, the front and back sides thereof are both brought to flat surfaces respectively. As a result, a trace of the air vent cured resin 9 is not prominent as compared with the resin burrs 11 while being designated at numerals 9 in FIG. 3 and FIG. 1(a) in the semiconductor device 20 according to the first embodiment. However, since each air vent is provided outside the length (b) as a groove in the mold die, the air vent cured resin 9 distinctly exists on the leads in a state in which the lead frame 1 shown in FIGS. 1(a) and 1(b) is shown.

As shown in FIGS. 5 and 6, the semiconductor device 20 has a tub 25 within the package 5. A semiconductor chip 27 is fixed to its corresponding upper surface of the tub 25 with a jointing material 26 interposed therebetween. The tub 25 is smaller than the semiconductor chip 27. The tub 25 has a structure where it is supported by the four tub-suspension leads 4. Namely, the tub 25 and the tub-suspension leads 4 are integrally formed.

Unillustrated electrodes formed on the surface of the semiconductor chip 27, and inner ends of the leads 3 are respectively electrically connected to one another by conductive wires 28. The tub 25, semiconductor chip 27, and the wires 28a are placed within the package 5. The means for electrically connecting the electrodes of the semiconductor chip 27 and the leads 3 respectively may take another configuration.

When the tub-suspension leads 4 are used as external electrode terminals, the ground electrode of the semiconductor chip 27 and the tub-suspension leads 4 may be connected to one another by the wires 28.

Figure 7:
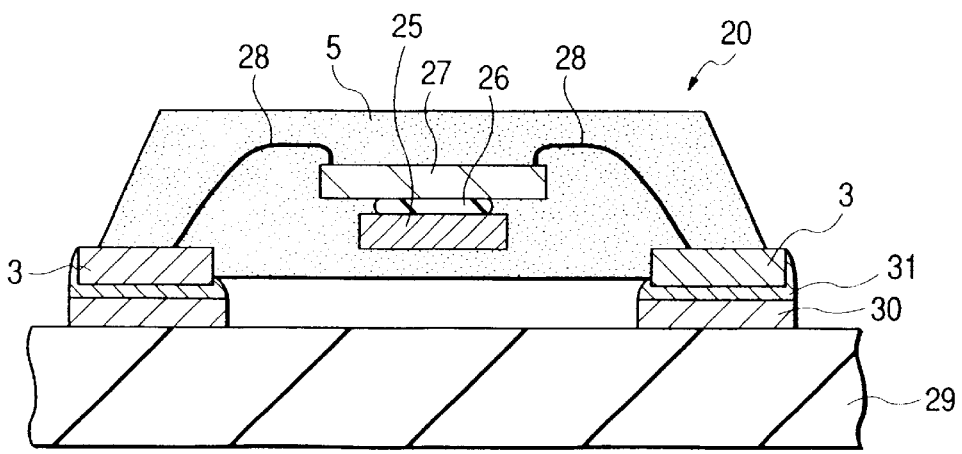
FIG. 7 is a cross-sectional view showing the state of mounting of the semiconductor device according to the first embodiment.

FIG. 7 is a cross-sectional view showing the mounting of a semiconductor device 20 on a wiring board or substrate 29. Lands 30 are provided on one surface of the wiring board 29 in association with leads 3 and tub-suspension leads 4 which serve as external electrode terminals of the semiconductor device 20. Further, the leads 3 and the tub-suspension leads 4, which serve as the external electrode terminals of the semiconductor device 20, are respectively superimposed on these lands 30 and electrically connected thereto with a bonding or jointing material 31 interposed therebetween.

A description will next be made of a specific manufacture of a semiconductor device 20. FIG. 36 is a flowchart showing a method of manufacturing the non-leaded type semiconductor device, i.e., QFN according to the first embodiment. The semiconductor device 20 is manufactured through respective process steps of Steps 101 through 106.

Namely, after the starting of work, the semiconductor device 20 is manufactured through respective steps of chip bonding (S101), wire bonding (S102), molding (S103), plating (S104), and pinch-cut (S105) and lead tip cutting (S106) by composite cut molding, and its work is ended.

Figure 9:
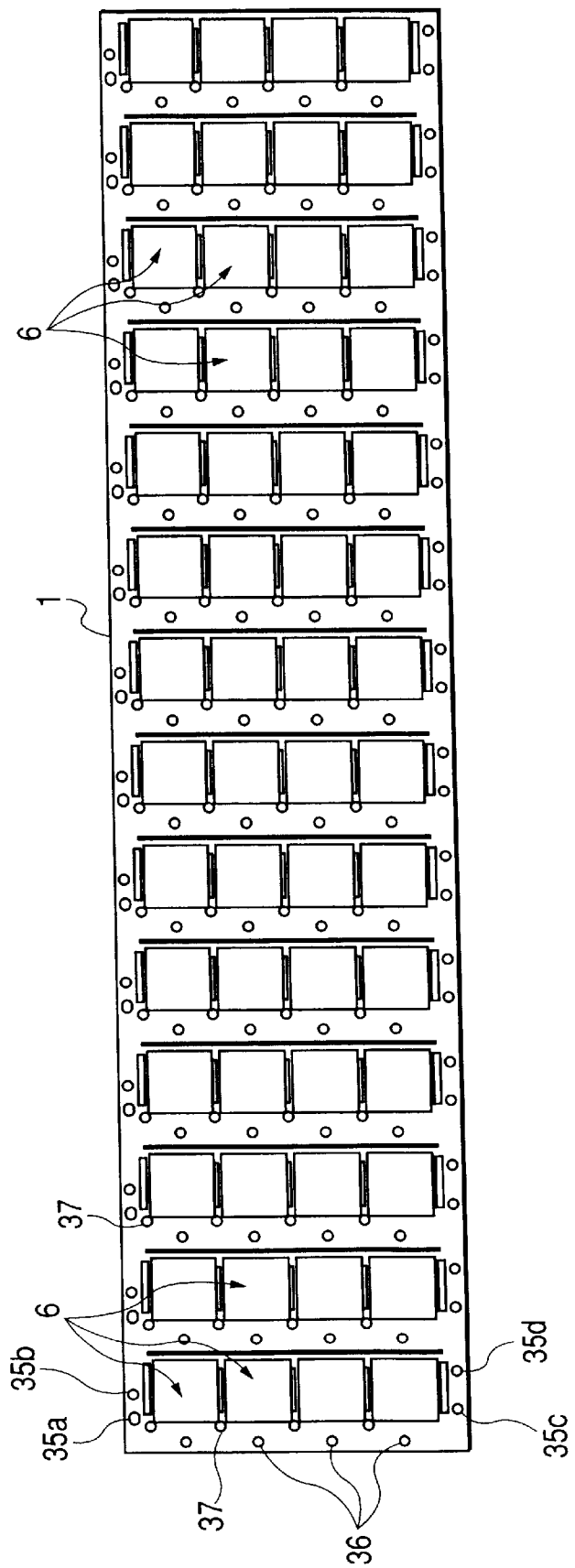
FIG. 9 is a plan view showing a lead frame employed in the manufacturing method of the semiconductor device according to the first embodiment.

Upon the manufacture of the semiconductor device 20 according to the first embodiment, such a matrix-configured lead frame 1 as shown in FIG. 9 is prepared. The lead frame 1 is configured in such a manner that unit lead frame patterns 6 are arranged with 4 rows along an X direction and with 14 columns along a Y direction. Fifty-six semiconductor devices 20 can be fabricated from one sheet of lead frame 1. Guide hole lands 35a through 35d used to transfer and position or locate the lead frame 1 are provided on both sides of the lead frame 1.

Upon a transfer mold, runners are located between the respective rows. Thus, ejector pin holes 36 through which ejector pins are capable of extending, are provided to separate a runner cured resin from the lead frame 1. In order to separate a gate cured resin cured at a gate portion, which branches off the runners and flows into its corresponding cavity, from the lead frame 1, ejector pin holes 37 through the which ejector pins are capable of extending, are provided.

Figure 10:
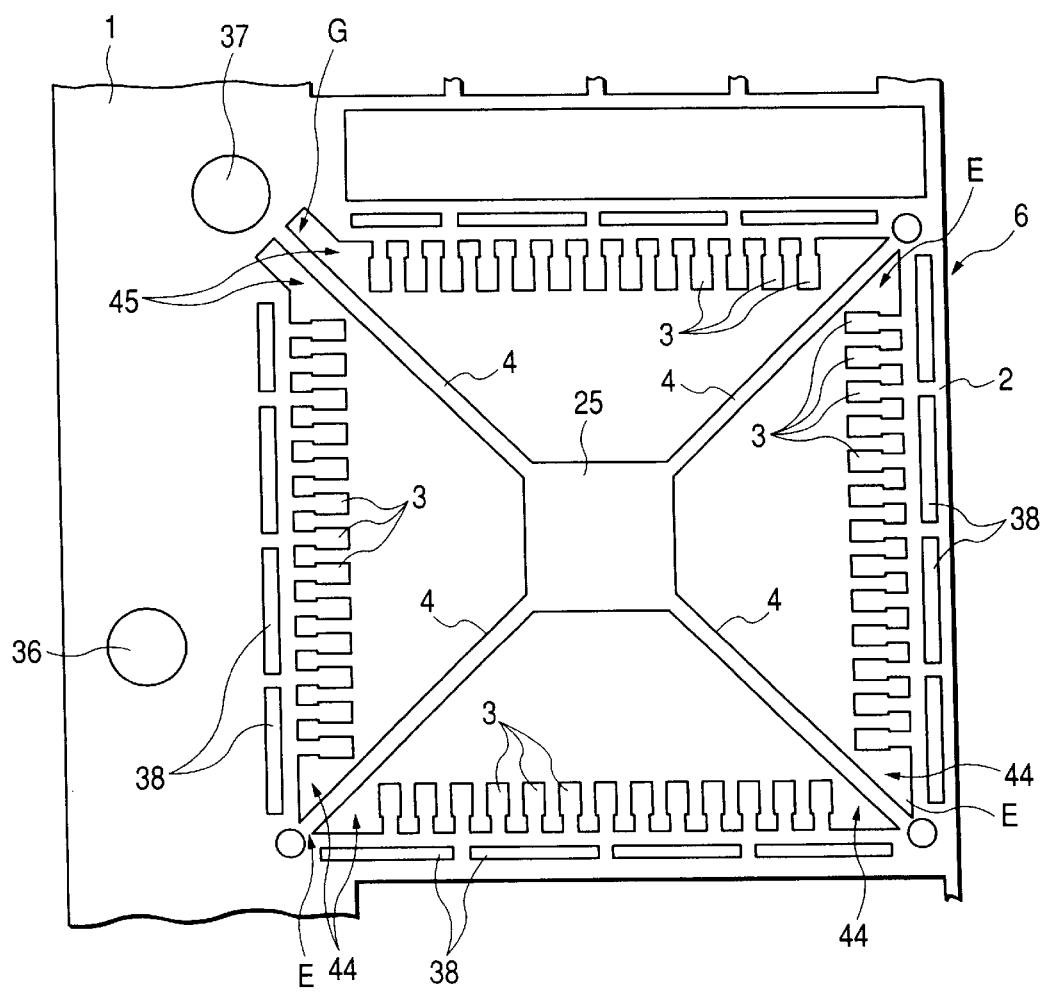
FIG. 10 is a plan view depicting a unit lead frame pattern portion of the lead frame.

FIG. 10 is a plan view showing a unit lead frame pattern 6. The unit lead frame pattern 6 is formed as a pattern having a frame portion 2 shaped in the form of a rectangular frame, a plurality of leads 3 extending inwardly from inside the respective sides of the frame portion 2, and tub-suspension leads 4 which respectively extend inwardly of the frame portion from the four corners of the frame portion 2 and support a central tub 25. The frame portion 2 has slits 38 intermittently provided at their sides in their side directions. Thus, the respective portions of the frame portion 2 for supporting the leads 3 can be changed elastically.

A frame-portion corner (cornered portion) of the tub-suspension lead 4, which faces the ejector pin hole 37, is defined as a point where a gate (G) is located. Other three corners of the frame portion 2 are defined as air vents (E) are located.

Figure 14:
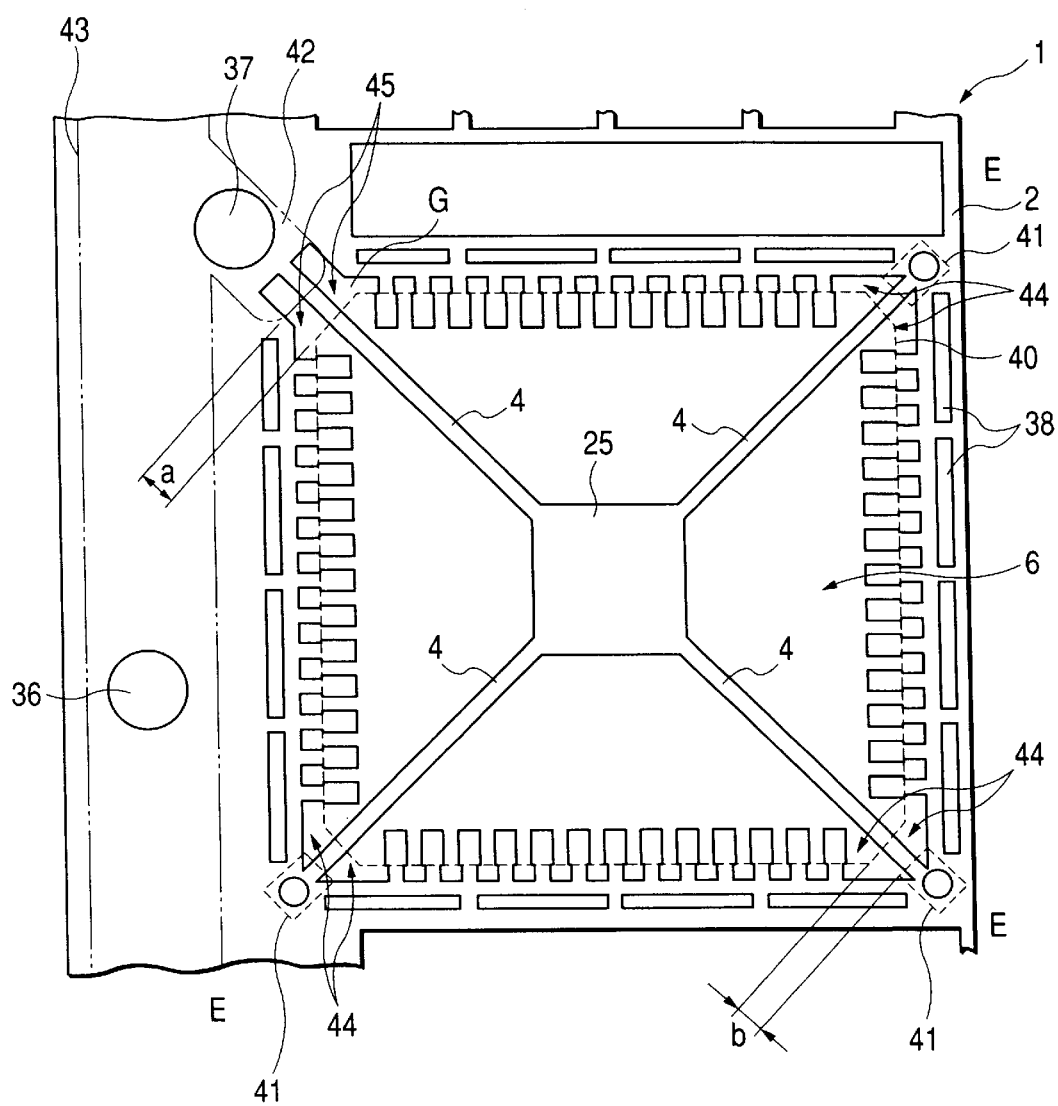
FIG. 14 is a plan view illustrating the correlation between a cavity, a resin flow passage or path and a lead frame formed in the single-sided mold by a mold die.

FIG. 14 is a diagram showing the unit lead frame pattern 6 and a recess defined in a parting face of one mold of a mold die. A square portion having such edges as to cross portions lying in the course of the leads 3 is a cavity 40 for forming the package 5. Small rectangular portions of the upper right, lower right and lower left corners of the frame portion 2 correspond to air vent grooves 41, and the upper left corner of the frame portion 2 corresponds to a gate groove 42. A runner groove or trench 43 is provided along the left side of the frame portion 2. An ejector pin hole 36 is provided in the central portion of the width of the runner groove 42.

No groove for the air vent is provided in an area for a length (b) between the cavity 40 and each air vent groove 41. Air vent areas 44 are respectively formed by areas surrounded by the tub-suspension leads 4 at portions including the areas for the lengths (b), the adjacent leads 3 and the frame portions. An inner end of each air vent groove 41 overlaps with its corresponding air vent area 44. Thus, air, which flows out from the cavity 40, flows into each air vent groove 41 through such air vent area 44.

No groove for the gate is provided in an area for a length (a) between the cavity 40 and the gate groove 42. Air vent areas 45 are formed by areas surrounded by the tub-suspension lead 4 at portions including the area for the length (a), the adjacent leads 3 and the frame portions. An inner end of the gate groove 42 overlaps with its corresponding gate areas 45. Thus, a resin, which flows into the gate groove 42, flows into the cavity 40 through such gate areas 45.

Further, the tub-suspension leads 4 are stepwise bent by one stage in the course thereof to elevate or lift the tub 25 upwardly.

Figure 11:
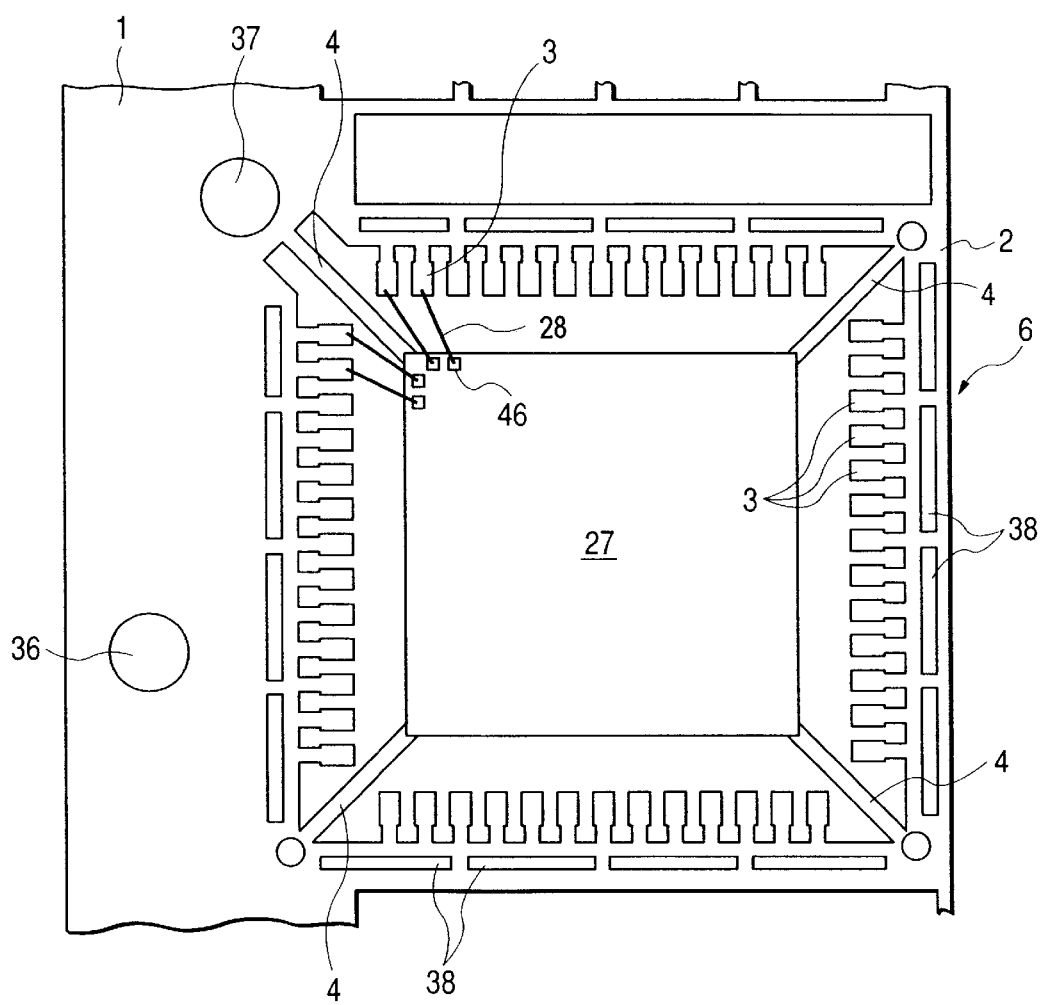
FIG. 11 is a plan view showing a state in which a semiconductor chip is fixed to the lead frame, and electrodes of the semiconductor chip and lead inner ends are connected to one another by wires in accordance with the manufacturing method of the semiconductor device according to the first embodiment.

The semiconductor device 20 is fabricated using such a lead frame 1. Namely, as shown in FIG. 11, a semiconductor chip 27 is fixed onto its corresponding tub 25 through an unillustrated bonding material (chip bonding: S101). Electrodes 46 of the semiconductor chip 27 and their corresponding inner ends of leads 3 are electrically connected to one another by means of conductive wires 28 (wire bonding: S102).

Figure 13:
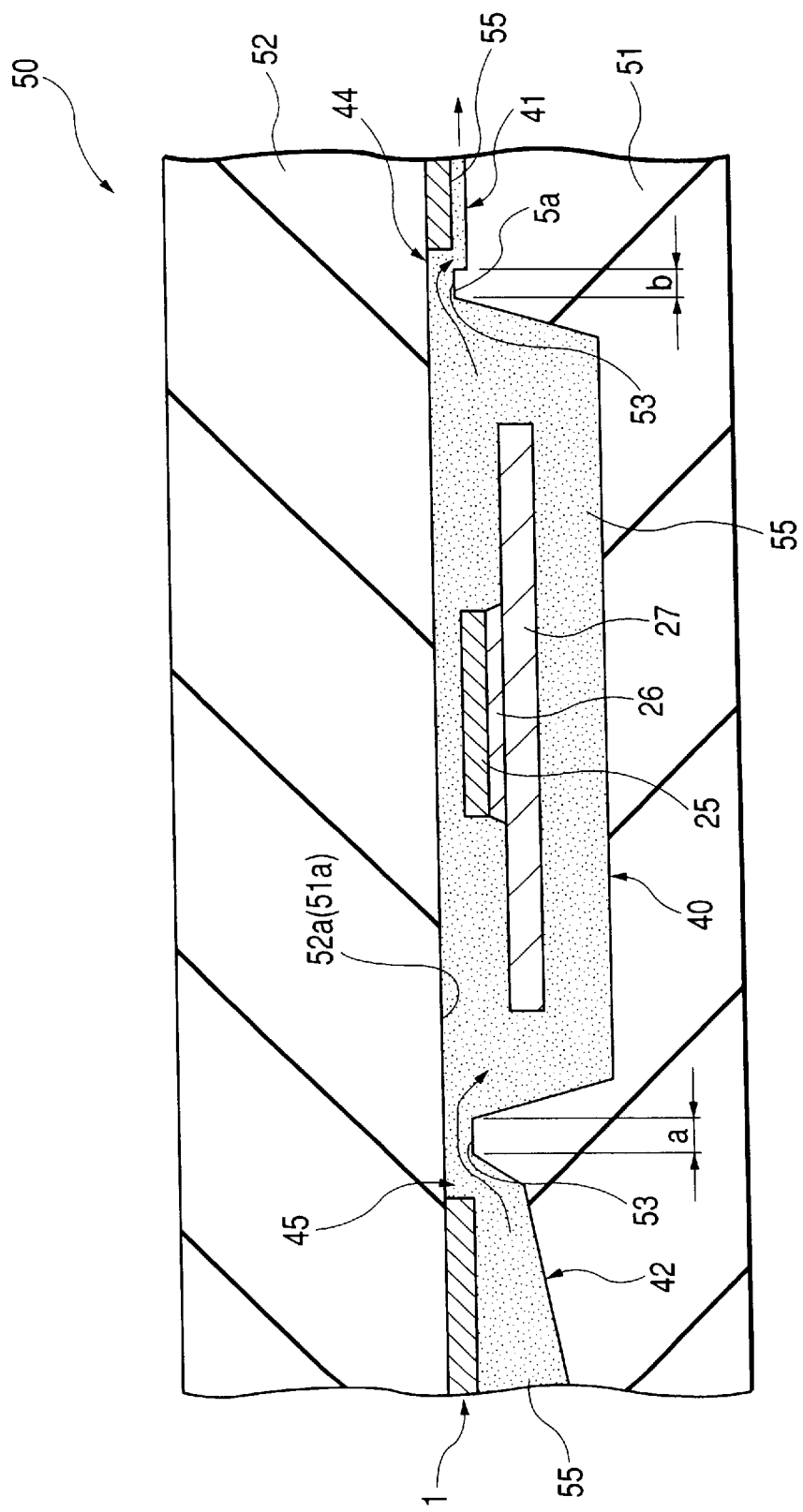
FIG. 13 is a cross-sectional view showing a state in which a package is formed on one surface of a lead frame in accordance with the manufacturing method of the semiconductor device according to the first embodiment.

Next, the lead frame 1 whose assembly has been finished, is single-sided molded to form a package 5 (mold: S103). The single-sided molding is carried out by a transfer mold device. Referring to FIG. 13, the lead frame 1 in which the chip bonding and the wire bonding have been completed, is clamped onto a mold die 50 comprising a lower mold 51 and an upper mold 52 of the transfer mold device.

As shown in FIG. 13, a parting face 52a of the upper mold 52 becomes flat and hence one surface of the lead frame 1 is closely bonded to the parting face 52a. As described above, a cavity 40 for forming the package 5, and an unillustrated runner groove, a gate groove 42 and an air vent groove 41 for guiding a resin melted in the cavity 40 are provided in a parting face 51a of the lower mold 51.

In the parting face 51a of the lower mold 51, the circumference of the periphery of the cavity 40 has a face 53 recessed by the same size as the thickness of the lead frame 1, i.e., the thickness of each of the leads 3 and the tub-suspension leads 4. Thus, the leads 3 and tub-suspension leads 4 are clamped onto the lower mold 51 and the upper mold 52 by the recessed face 53 and the parting face 52a of the upper mold 52 in a closely contact state. Thus, the tub 25 and the semiconductor chip 27 are kept in a floating state at the middle stage of the cavity 40.

By feeding a molten resin 55 via the runner groove and the gate groove 42, the resin 55 flows into the cavity 40 through a gate area 45. Air lying within the cavity 40 enters each air vent groove 41 through an air vent area 44 and escape from the cavity 40. With the escaping of such air therefrom, the resin 55 also enters into the air vent areas 44 and the air vent grooves 41.

Figure 12:
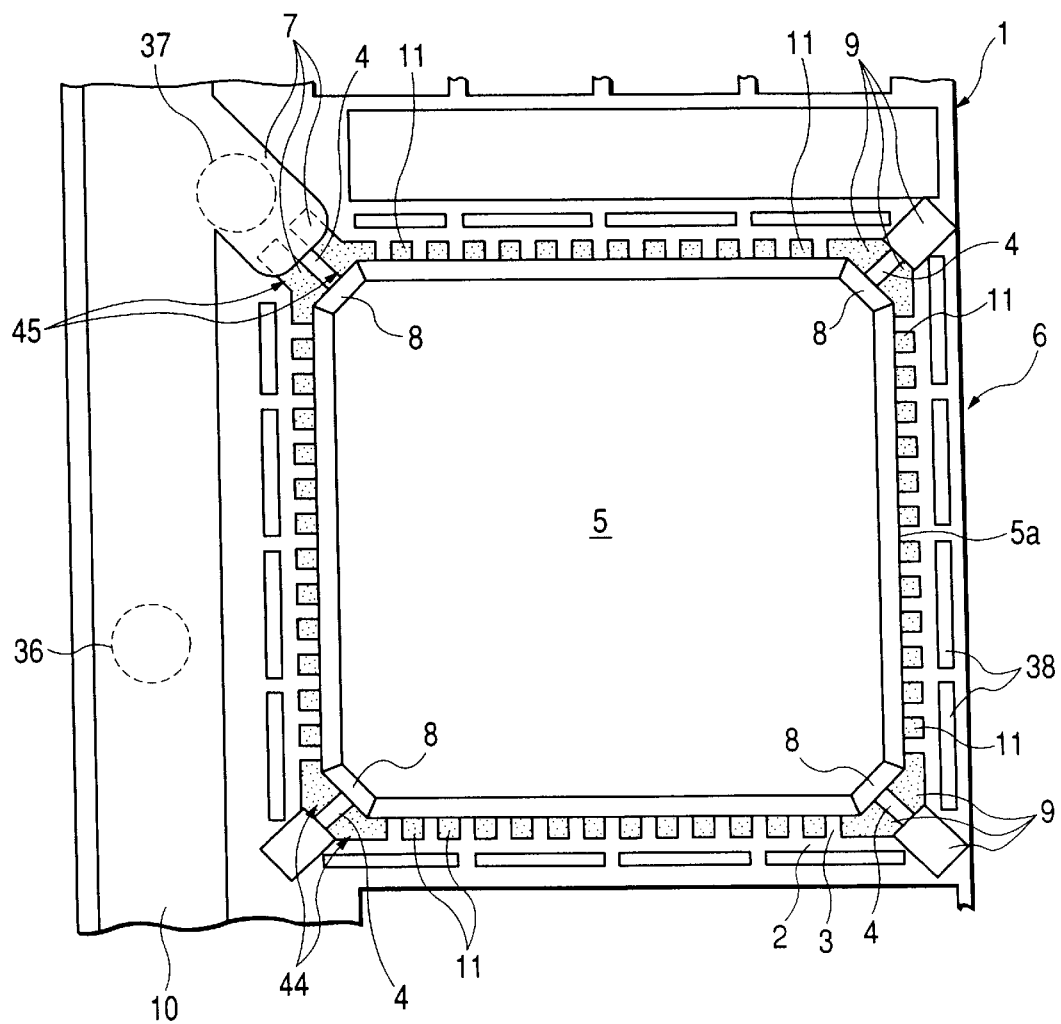
FIG. 12 is a plan view illustrating a state in which a package is formed on one surface of the lead frame by means of a single-sided mold in accordance with the manufacturing method of the semiconductor device according to the first embodiment.

Accordingly, the resin lying within the mold die 50 is cured according to the following resin cure processing (curing process). FIG. 12 is a diagram of a resin cured portion as viewed in a mold-opened state of the mold die 50.

As shown in FIG. 12, the package 5 is formed in the center of the unit lead frame pattern 6. A runner cured resin 10 formed within its corresponding runner groove by curing exists on the left side of the package 5. A gate cured resin 7 formed within its corresponding gate groove 42 by curing exists on the left side. Air vent resins 9 formed within their corresponding air vent grooves 41 formed on the extensions of the upper right, lower right and lower left cornered portions of the package 5 exist.

In FIG. 12, portions to which dots (matt spots) are applied, respectively correspond to resin portions, i.e., resin burrs 11 each having the same thickness as each of the leads 3, the tub-suspension leads 4 and the frame portion 2. The gate areas 45 and air vent areas 44 exist on both sides of the four-cornered tub-suspension leads 4 of the package 5. The gate cured resins 7 and the air vent cured resins 9 are formed inside their areas.

Next, a plating process is carried out (S104). The plating process is used upon implementation of the semiconductor device 20. Although not illustrated in the drawing, for example, a thickness of about 20 µm to about 30 µm is formed on the surface of each of the leads 3 and the tub-suspension leads 4, which is exposed to the mounting surface 21 of the package 5.

Figure 16:
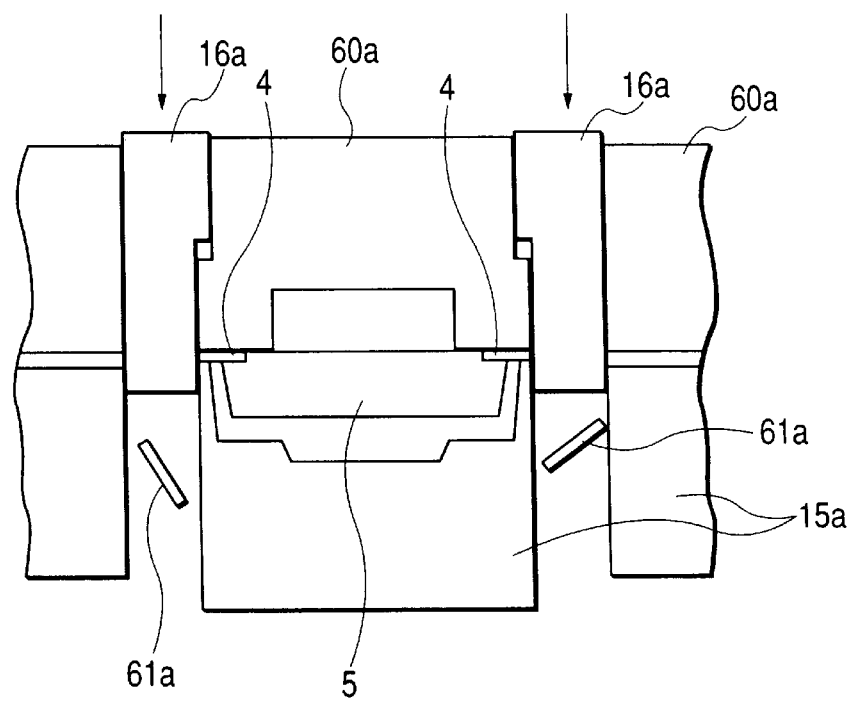
FIG. 16 is a typical view illustrating a state in which the gate cured resin or the like is cut.

Next, as shown in FIG. 16, pinch-cut (S105) and lead tip cutting (S106) are carried out by a press machine. The pinch-cut (the cutting of four-cornered tub-suspension leads 4) and the lead tip cutting (the cutting of leads extending in the X/Y directions) are carried out by a composite cut mold attached to the press machine.

The pinch-cut is as follows. As shown in FIG. 16, a lead frame 1 is clamped between a die 15a and a stripper 60a. Four-cornered tub-suspension leads 4 and a gate cured resin 7 extended to both sides of the tub-suspension lead 4, and air vent cured resins 9 are respectively cut by die-punching using punches 16a. The cut pieces 61a drop in spatial portions of the die 15a and are collected at a predetermined place by means of forced exhaust based on vacuum absorption or the like.

Thus, the formation of the gate areas 45 and the air vent areas 44, each of which falls within the thickness of each lead, makes it possible to ensure an area to apply a die to lead surfaces on the package side and cut them from the mounting surface side of the leads by the punches. The gate cured resins 7, which remain upon breaking and removal of the gate cured resins 7, are assuredly held in the spatial portions of the pinch-cutting die 15a even if they have variations in size to some extent. Therefore, the dies and punches at the cutting lose no stability due to the remaining gate cured resins 7.

Figure 15:
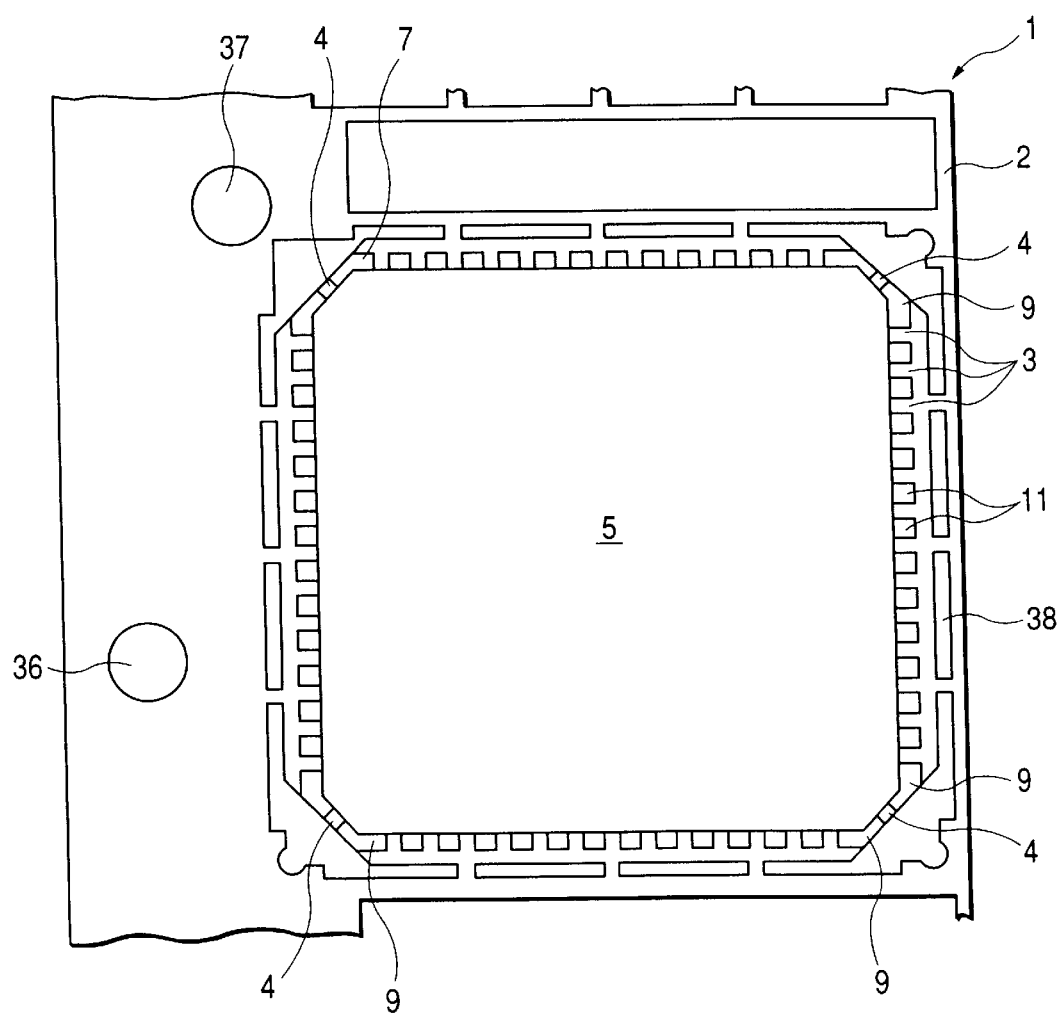
FIG. 15 is a plan view showing a lead frame formed by cutting tub-suspension leads and a gate cured resin or an air vent cured resin placed on both sides of the tub-suspension leads in accordance with the manufacturing method of the semiconductor device according to the first embodiment.
Figure 17:
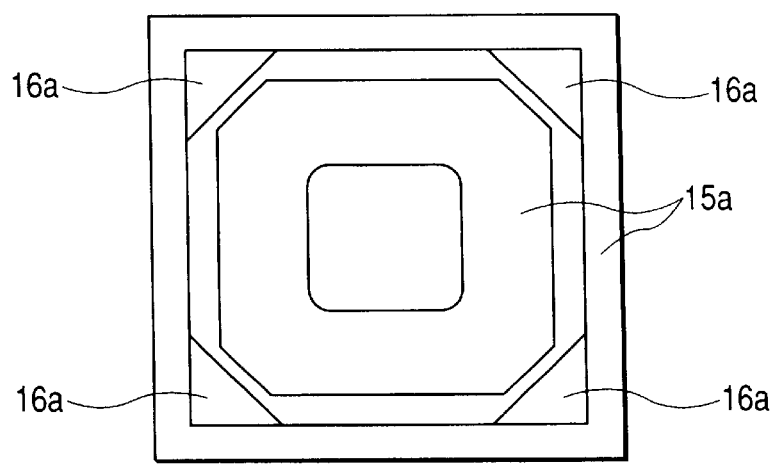

FIG. 17 is a typical plan view showing dies 15a and punches 16a. FIG. 15 is a plan view showing a lead frame in which a tub-suspension lead 4 and gate cured resins 7 placed on both sides of the tub-suspension lead 4, and tub-suspension leads 4 and air vent cured resins 9 placed on both sides of the tub-suspension leads 4 are cut.

Figure 18:
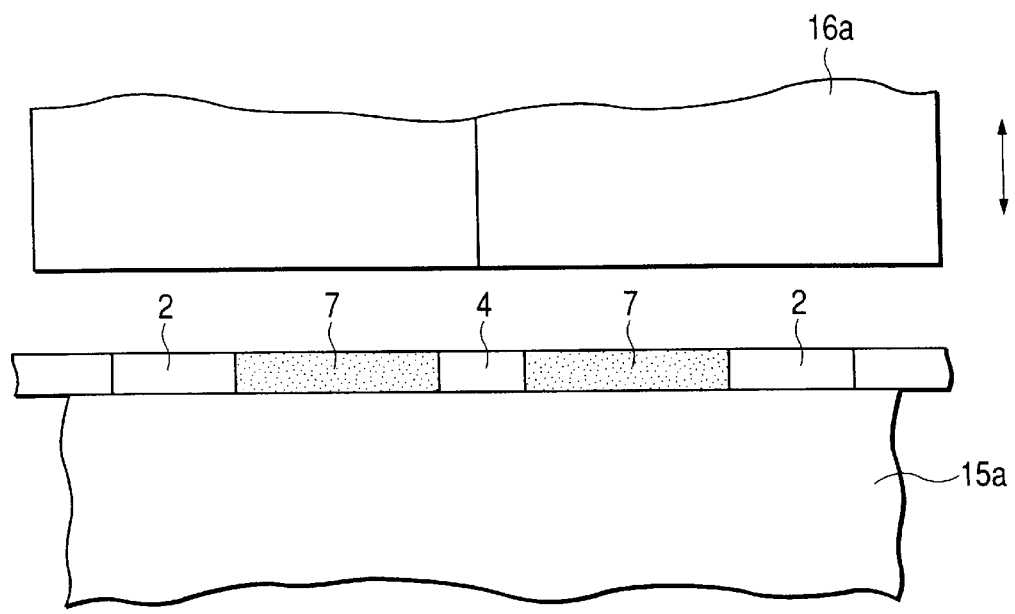

FIG. 18 is a diagram showing a state in which a tub-suspension lead 4 and gate cured resins 7 located on both sides of the tub-suspension lead 4 are cut by a die 15*a* an a punch 16*a*. At cut portions of the tub-suspension leads 4 at the base of the package 5, as shown in FIG. 18, the gate cured resins 7 are formed in a space surrounded by the tub-suspension leads 4, the leads 3 located on both side of the tub-suspension leads 4, and the frame portion 2 with the same thickness of each of the frame portion 2, tub-suspension leads 4 and leads 3.

Since the obverse and reverse sides of each gate cured resin 7 are flush with the front and back of each of the leads 3 and the tub-suspension leads 4 or the like and are protected and flattened, the occurrence of resin waste can extremely be reduced. Since the gate cured resins 7 are cut in a state of being protected by the frame portion 2, the leads 3 and the tub-suspension leads 4, a resin crack is not produced and does not extend deep within the package 5. Accordingly, moisture resistance of the package is also improved.

Figure 19:
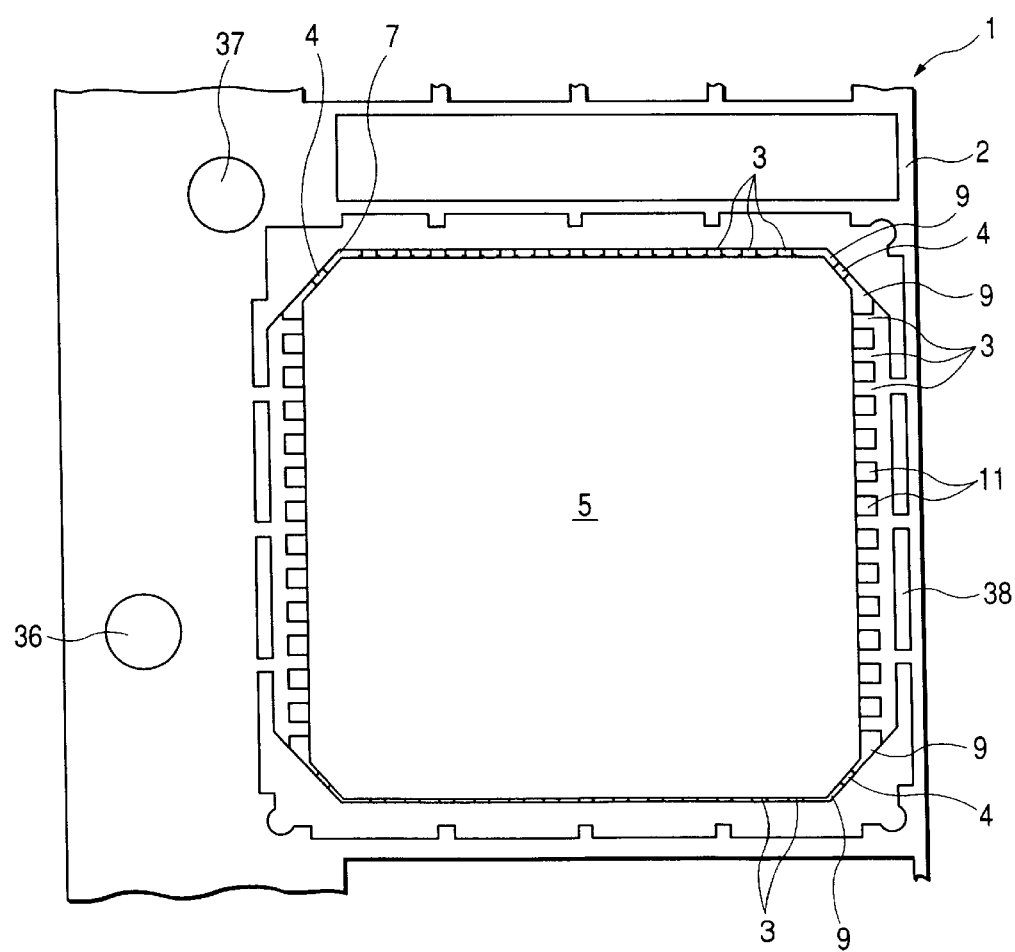
FIG. 19 is a plan view showing the lead frame from which leads extending along an X direction are cut in accordance with the manufacturing method of the semiconductor device according to the first embodiment.
Figure 20:
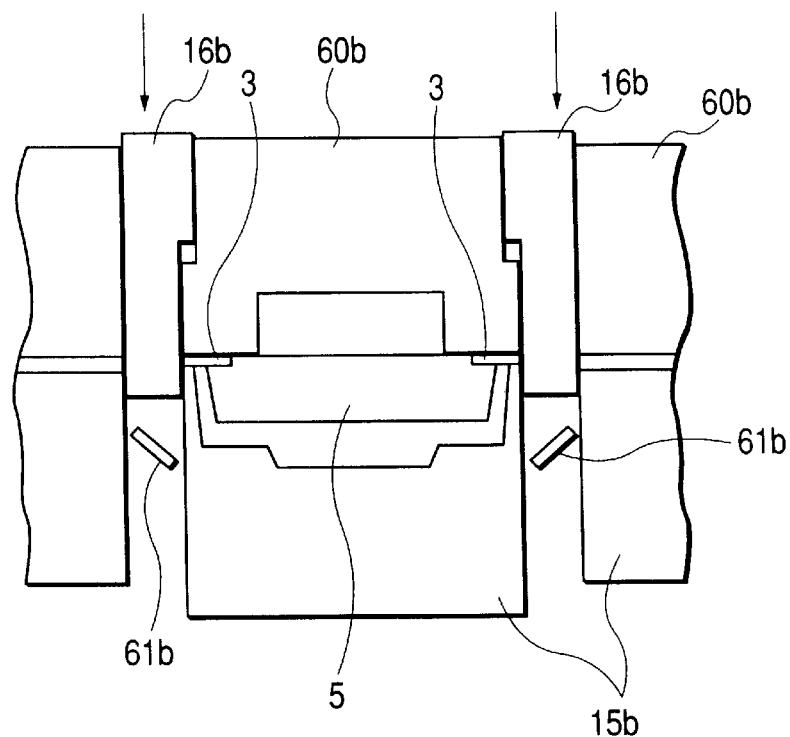
FIG. 20 is a typical view illustrating a state in which the leads extending along the x direction are cut.
Figure 21:
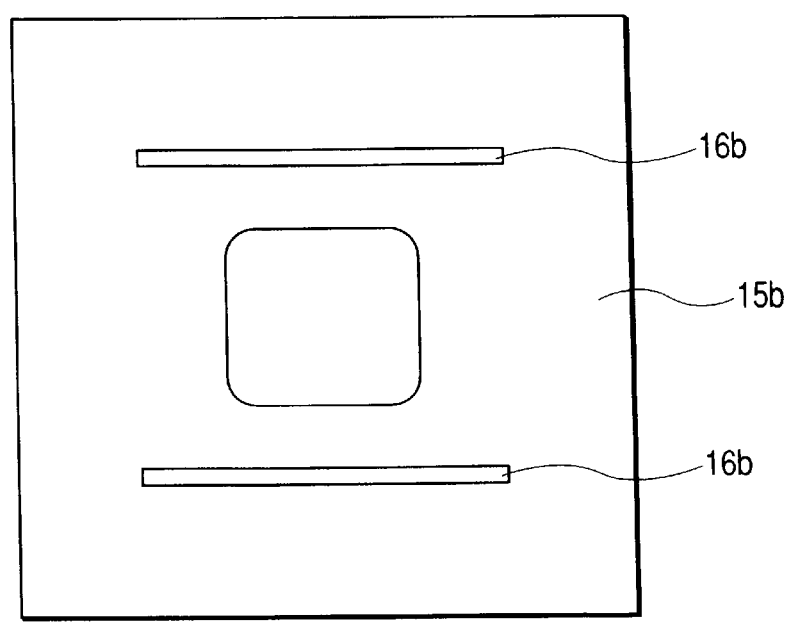
FIG. 21 is a typical plan view depicting a cutting die for cutting the leads extending along the X direction.

The lead tip cutting is divided into two process steps of X-direction lead cutting and a Y-direction lead cutting in the case of composite cut molding. Namely, the X-direction lead cutting is carried out as shown in FIG. 20. A lead frame is clamped between a die 15*b* and a stripper 60*b* and each lead 3 extending along the X direction is punched out by punches 16*b*. Patterns for the die 15*b* and the punches 16*b* are formed as shown in FIG. 21. The punched-out lead frame 1 is formed as shown in FIG. 19. Further, cut pieces 61*b* drop into a spatial portion defined in the die 15*b* and are thereafter collected at a predetermined location by means of forced exhaust based on vacuum absorption or the like.

Figure 22:
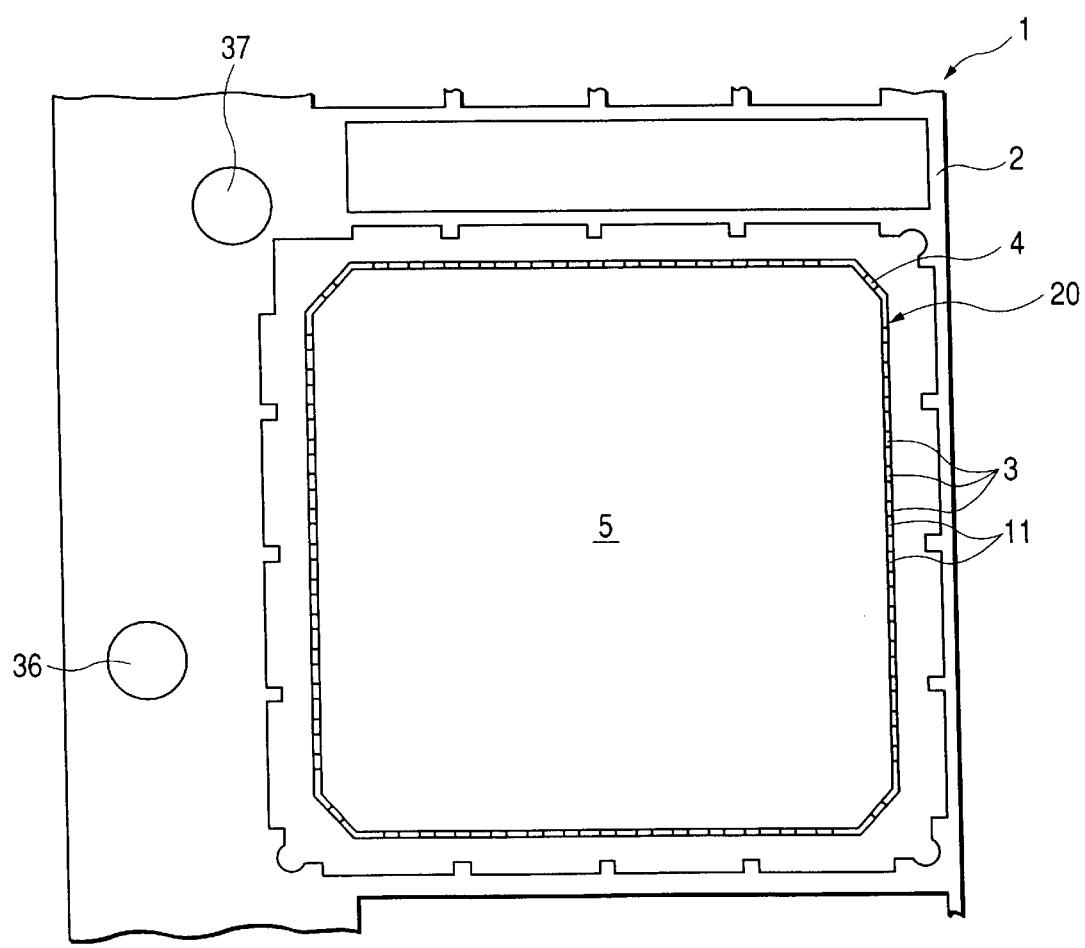
FIG. 22 is a plan view showing a semiconductor device obtained by cutting leads extending along a Y direction in accordance with the manufacturing method of the semiconductor device according to the first embodiment, and a remaining lead frame portion.
Figure 23:
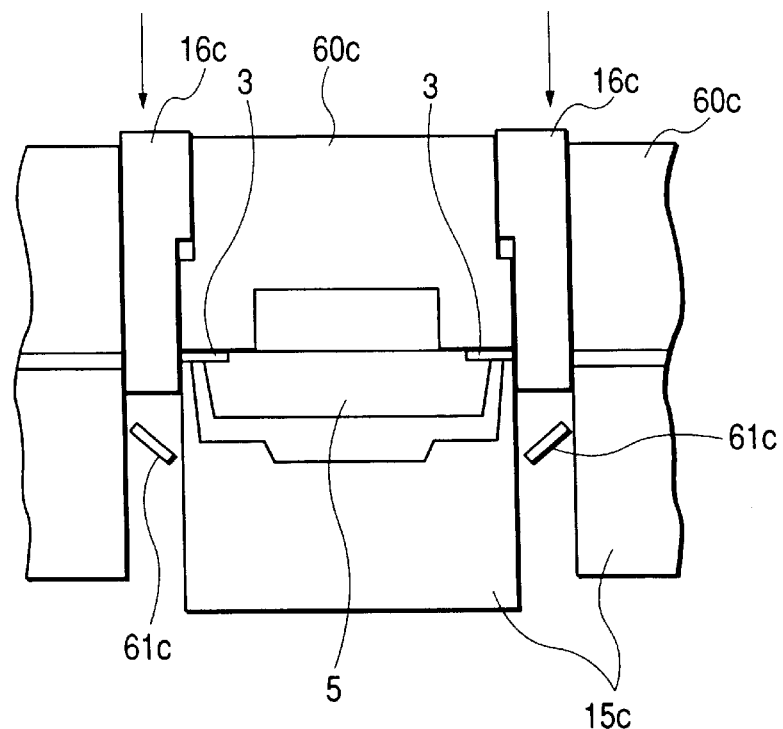
FIG. 23 is a typical view illustrating a state in which the leads extending along the Y direction are cut.
Figure 24:
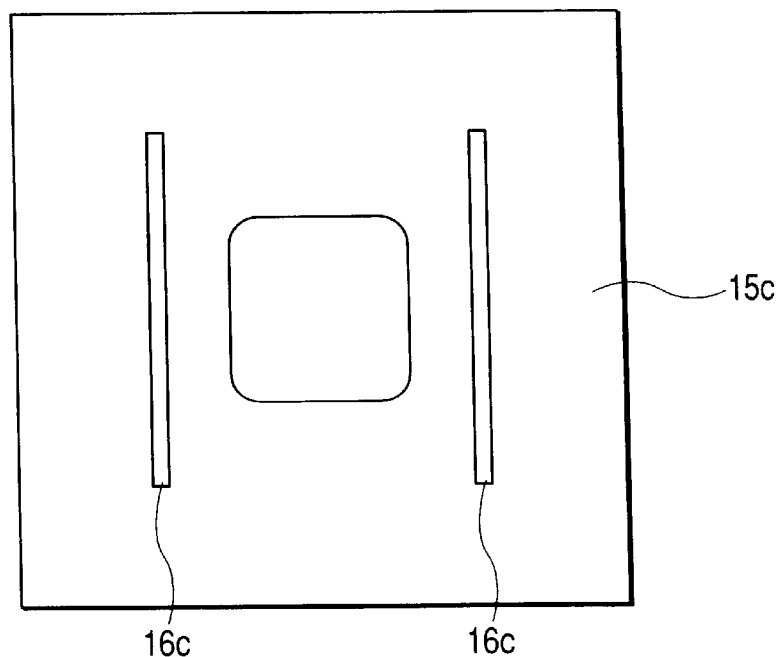
FIG. 24 is a typical plan view depicting a cutting die for cutting the leads extending along the Y direction.

The Y-direction lead cutting is carried out as shown in FIG. 23. A lead frame 1 is clamped between a die 15*c* and a stripper 60*c*, and leads 3 extending along the Y direction are punched out by means of punches 16*c*. Patterns for the die 15*c* and the punches 16*c* are formed as shown in FIG. 24. The punched-out lead frame 1 is formed as shown in FIG. 22. A package 5 at this stage is cut and separated from a frame portion 2 of the lead frame 1, so that a non-leaded type semiconductor device (QFN) 20 is fabricated. Cut pieces 61*c* drop into a spatial portion defined in the die 15*c* and are collected at a predetermined place by means of forced exhaust based on vacuum absorption or the like.

The pinch-cut and lead tip cutting are carried out at the base of the package 5. For example, protruding lengths of the leads 3 and the tub-suspension leads 4 become 0.1 mm or less. Even in this case, the leading lines of the leads 3 and tub-suspension leads 4, and the cut lines of resin burrs 11, gate cured resins 7 and air vent cured resins 9 linearly extend without being brought into irregularities respectively.

Figure 25:
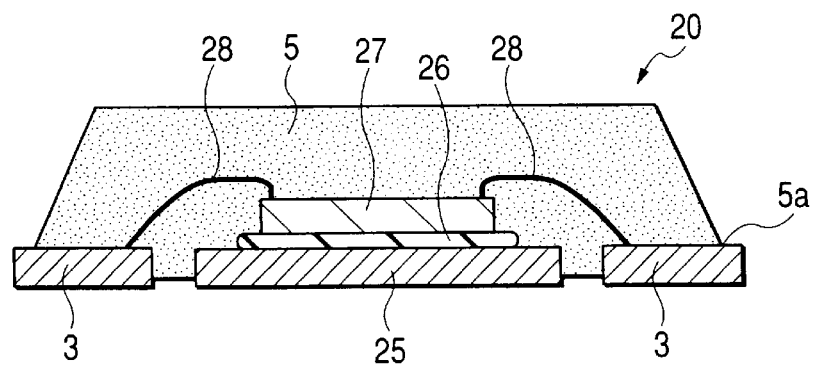
FIG. 25 is a cross-sectional view showing another semiconductor device manufactured by using a flat lead frame wherein leads, a tub and tub-suspension leads are disposed on the same plane in the first embodiment.
Figure 26:
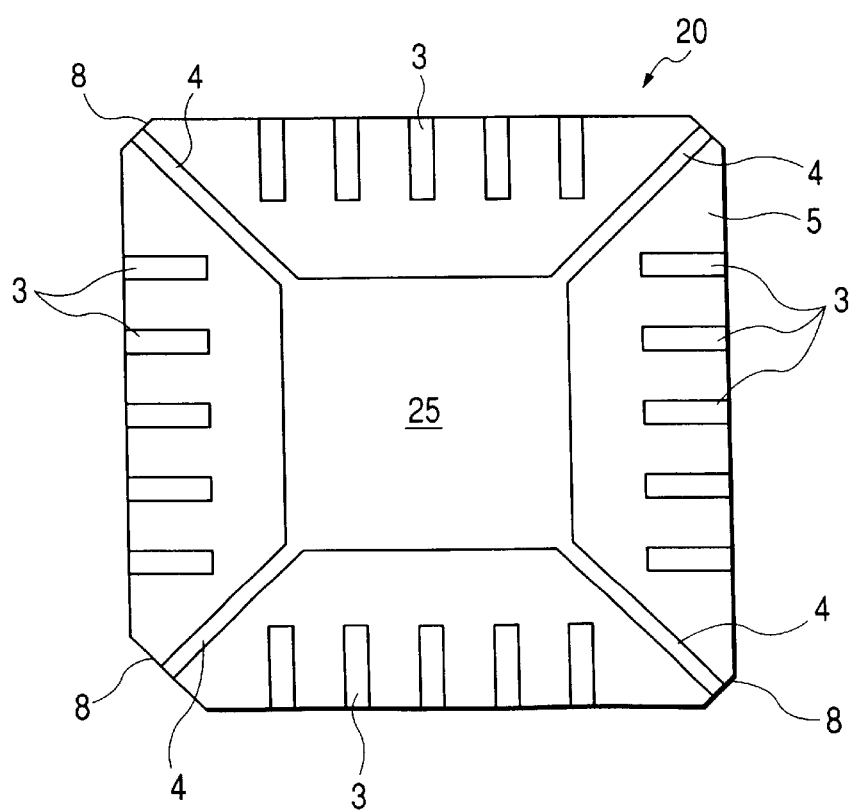
FIG. 26 is a bottom view of another semiconductor device shown in FIG. 25.

FIG. 25 is a cross-sectional view showing another semiconductor device 20 fabricated by using a flat lead frame in which leads 3, a tub 25 and tub-suspension leads 4 are placed on the same plane. FIG. 26 is a bottom view of another semiconductor device. In such a structure, the tub 25 and the tub-suspension leads 4 are exposed to a mounting surface 21 of a package 5 in their entirety. Therefore, when it is fixed to a mounting or printed board such as a wiring board, the exposed surfaces of tub 25 and tub-suspension leads 4 serve as heat dissipation surfaces and hence it is of practical use that the heat of the semiconductor chip 27 can be dissipated outside the package 5 rapidly. As a result, the semiconductor device 20 can stably be operated.

Figure 8:
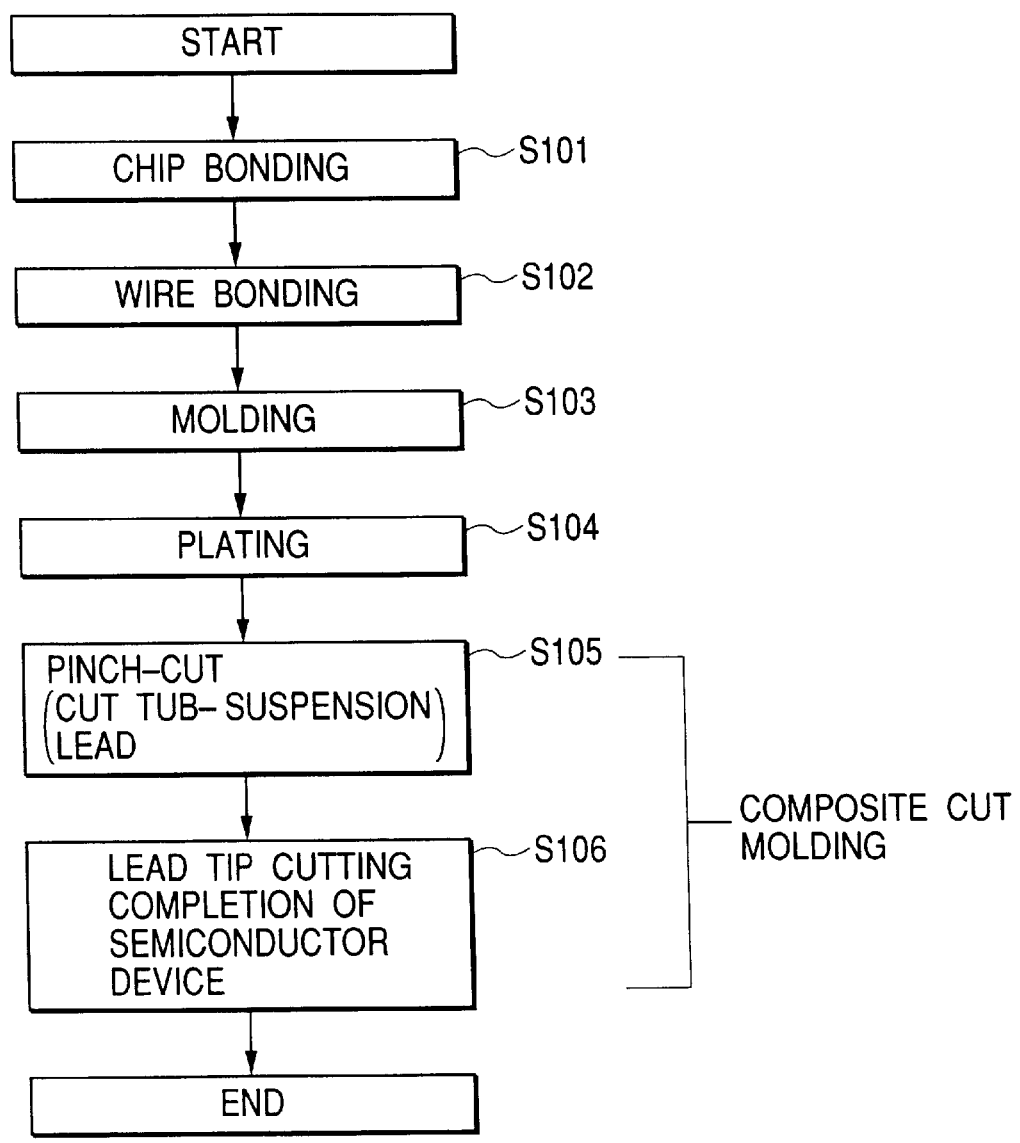
FIG. 8 is a flowchart for describing the method of manufacturing the semiconductor device according to the first embodiment.

When a plating film is provided on the surface of a lead frame in a lead frame state, the plating process shown in the flowchart shown in FIG. 8 becomes unnecessary.

According to the first embodiment, the following advantageous effects are brought about.

(1) The cutting of leads 3 and tub-suspension leads 4 that protrude from the periphery of a package 5, and the cutting of gate cured resins 7 and air vent cured resins 9 produced upon the formation of the package 5 are performed while a die and punches are being applied to portions respectively identical in thickness and whose front and back are flat. Thus, they can be cut by punches and a die without partly applying an on-cutting stress on the gate cured resins 7 and air vent cured resins 9 in a large way. It is therefore possible to reduce the occurrence of resin waste 17 to a large extent as compared with the conventional cutting method.

(2) According to the above (1), since the resin waste 17 can be prevented from occurring, the attachment and crimping of the resin waste 17 to lead surfaces serving as external electrode terminals due to the spattering of the resin waste 17, and the occurrence of flaws caused by the crimping can be restrained. It is also possible to ensure solderability at mounting and enhance mounting yields. Furthermore, the reliability of the mounting of a non-leaded type semiconductor device 20 can be improved.

(3) According to the above (2), since a matrix type lead frame takes a structure wherein unit lead frame patterns 6 are vertically and horizontally arranged in line, the prevention of the spattering of the resin waste 17 results in the prevention of contamination of the resin waste 17 on each unit lead frame pattern 6 around a predetermined unit lead frame pattern 6, whereby production yields can be improved to a great extent.

(4) According to the above (1), since the occurrence of the resin waste 17 can be restrained, the contamination caused by the cut-die resin waste 17 can be prevented from occurring, and the availability factor of a press machine for mounting a cut die can be improved.

(5) Since the gate cured resins 7 and air vent cured resins 9 around the package 5 are respectively identical to resin burrs 11 in obverse and reverse sides, it is difficult to visually confirm the gate cured resin 7 and air vent cured resins 9 on the periphery of the package 5 of the non-leaded type semiconductor device 20. Thus, the semiconductor device is look good and preferable even in outer appearance, and increases in commodity property.

(6) The cutting of leads 3 and tub-suspension leads 4 that protrude from the periphery of a package 5, and the cutting of gate cured resins 7 and air vent cured resins 9 produced upon the formation of the package 5 are performed at portions respectively identical in thickness and whose front and back are flat. Thus, they can be cut by punches and a die without partly applying an on-cutting stress on the gate cured resins 7 and air vent cured resins 9 in a large way. Therefore, such a resin crack as to extend toward the inside of the package 5 is not produced. As a result, no moisture enters the package 5 through the resin crack. Further, the package 5 increases in moisture resistance, and production yields are enhanced.

(7) According to the above (2) through (4) and (6), the manufacturing cost of a semiconductor device can be reduced in terms of high productivity and an improvement in yield. For example, the yield is improved about 0.5%.

Second Embodiment

Figure 27:
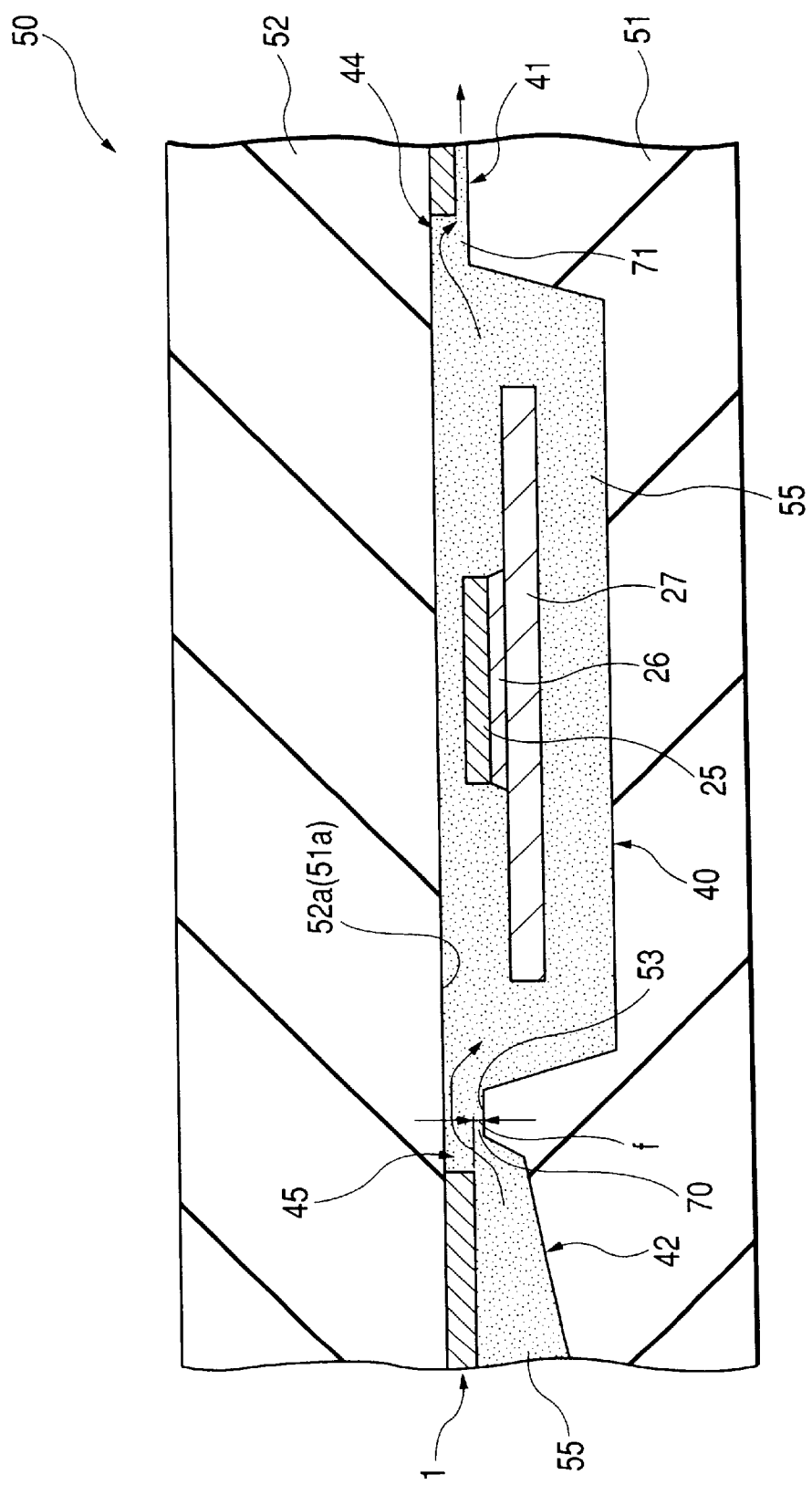
FIG. 27 is a typical cross-sectional view illustrating a transfer mold state obtained according to a method of manufacturing a semiconductor device showing another embodiment (second embodiment) of the present invention.
Figure 28:
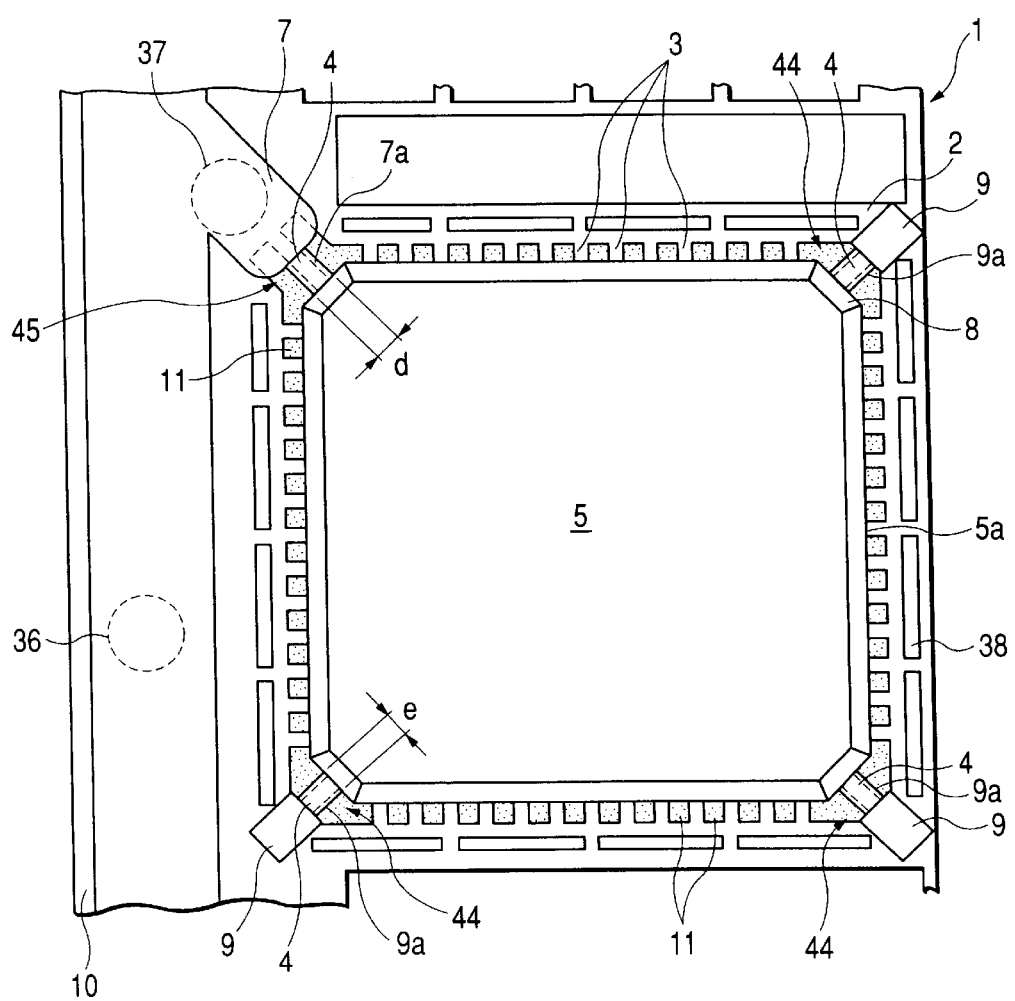
FIG. 28 is a typical plan view showing a lead frame single-sided molded in accordance with the method of manufacturing the semiconductor device according to the second embodiment.
Figure 29:
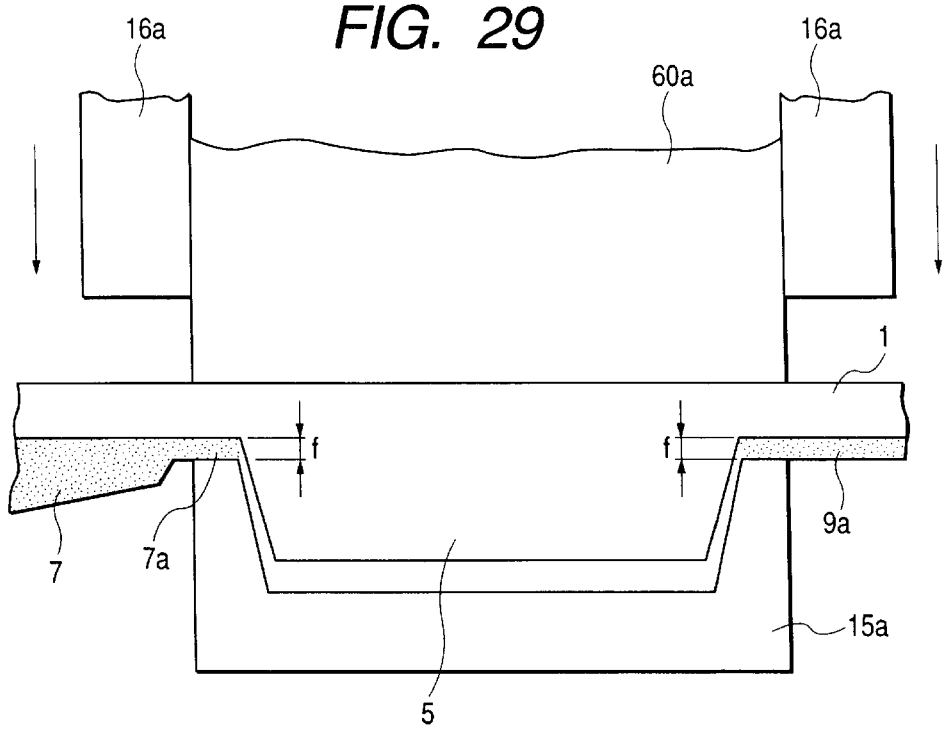
FIG. 29 is a typical cross-sectional view illustrating a state in which a gate cured resin and an air vent cured resin, and tub-suspension leads overlapping with these are cut in accordance with the method of manufacturing the semiconductor device according to the second embodiment.

FIGS. 27 through 29 are respectively diagrams showing a method of manufacturing a semiconductor device according to another embodiment (second embodiment) of the present invention, wherein FIG. 27 is a typical cross-sectional view showing a transfer mold state, FIG. 28 is a typical plan view showing a single-sided molded lead frame, and FIG. 29 is a typical cross-sectional view showing a state in which gate cured resins, air vent cured resins and tub-suspension leads overlapping with these are cut.

The second embodiment is different from the first embodiment in that as shown in FIG. 27, a gate 70 having a width d and air vents 71 each having a width e are provided even on tub-suspension leads 4 at a resin injection place (G) and air vent places (E) corresponding to respective corners of a frame portion 2. The thickness of each of the gate 70 and the air vents 71 is made thinner by about f than the thickness of each of leads 3 and the tub-suspension leads 4. The thickness f ranges from about 20 μm to about 30 μm, for example, and serves as a flat surface.

Incidentally, the gate 70 and the air vents 71 may differ in groove depth. In this case, the bottom of each groove is made flat so as not to cause resin waste in a subsequent step.

The gate 70 is wider than the width of each tub-suspension lead 4, and overlaps with a gate area 45 on both sides of the tub-suspension leads 4 and is in communication therewith. Further, each of the air vents 71 is wider than the width of the tub-suspension lead 4, and overlaps with its corresponding air vent area 44 on both sides of the tub-suspension leads 4 and is in communication therewith. As a result, a gate cured resin 7a having a width d is formed between a package 5 and a gate cured resin 7 in a state of a post-transfer mold lead frame 1 as shown in FIG. 28. Further, air vent cured resins 9a each having a width e are respectively formed between the package 5 and air vent cured resins 9.

The cutting of the gate cured resin 7a and the tub-suspension lead 4 superposed thereon, and the cutting of the air vent cured resins 9a and the tub-suspension leads 4 superposed thereon are carried out by a die 15a and punches 16a as shown in FIG. 29 in a manner similar to the first embodiment.

Since portions of the gate cured resin 7a and the air vent cured resins 9a, which make contact with the die 15a and are supported thereby, are flat even in the case of such cutting, it is hard to cause resin waste and a resin crack in a manner similar to the first embodiment.

Incidentally, the gate width d and the air vent widths e may be set larger than the width of each tub-suspension lead 4 and connected to the gate area 45 and the air vent areas 44 to thereby less reduce resistance at resin injection.

Incidentally, the alignment of the heights of the gate cured resin 7a and the air vent cured resins 9a formed on the four-cornered tub-suspension leads 4 makes it possible to carry out pinch-cut stabler.

It is possible to prevent the occurrence of the resin waste and the resin crack and achieve an improvement in yield even in the case of the second embodiment in a manner similar to the first embodiment.

Third Embodiment

Figure 30A:
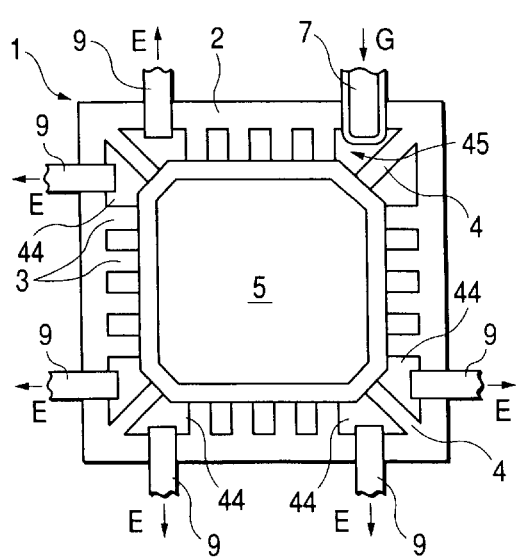
FIG. 30(a) and FIG. 30(b) are typical plan views showing a lead frame portion single-sided molded by a method of manufacturing a semiconductor device according to a further embodiment (third embodiment) of the present invention.

FIG. 30 is a typical plan view showing a lead frame portion single-sided molded by a method of manufacturing a semiconductor device according to a further embodiment (third embodiment) of the present invention. The present invention is a method of avoiding the superimposition of a gate and air vents on tub-suspension leads 4. Namely, in FIG. 30(a), the gate is provided so as to intersect a frame portion 2 to thereby cause its leading end to communicate with a gate region or area 45. Further, air vents are respectively provided so as to intersect the frame portion 2 to thereby cause their leading ends to communicate with their corresponding air vent regions or areas 44.

Figure 30B:
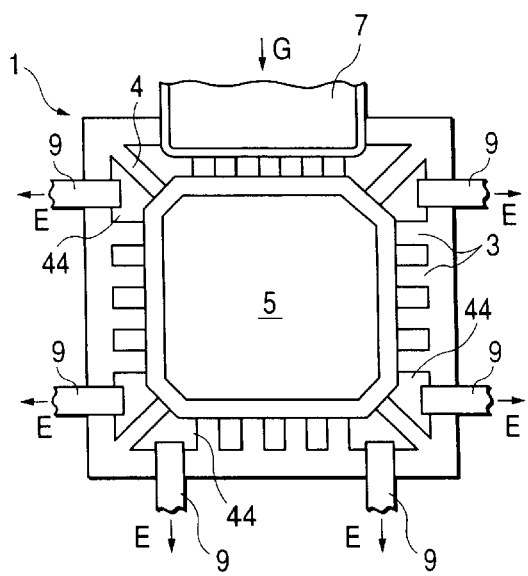
Figure 31:
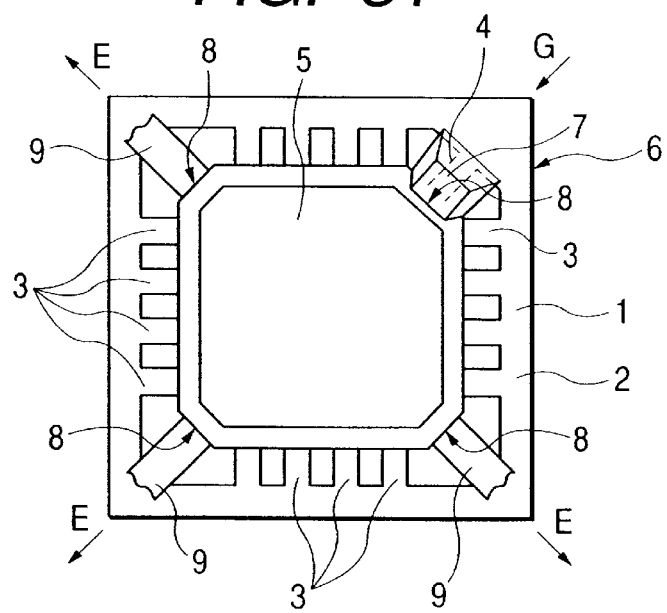
FIG. 31 is a plan view illustrating a conventional lead frame in which a package is formed on one surface thereof by a transfer mold.
Figure 32:
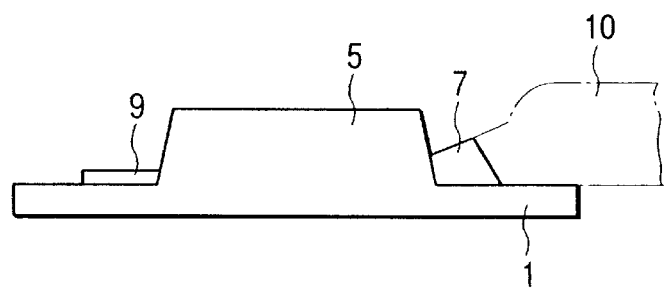
FIG. 32 is a typical side view depicting the lead frame.
Figure 33:
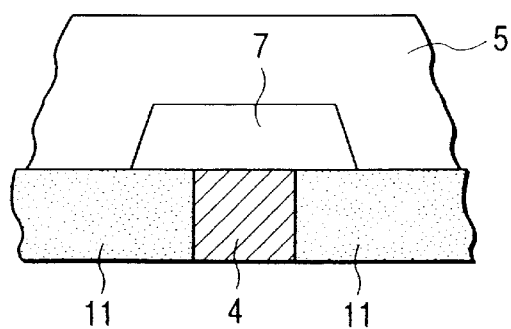
FIG. 33 is a typical cross-sectional view showing a gate cured resin, resin burrs, etc. of the lead frame.
Figure 34:
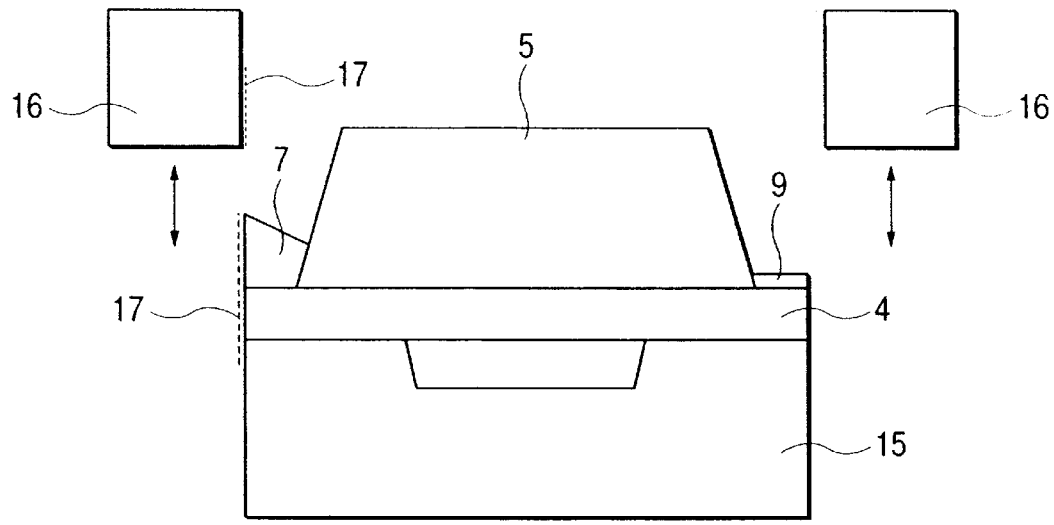
FIG. 34 is a typical view showing a state in which a conventional tub-suspension lead, and a gate cured resin and an air vent cured resin overlapping with the tub-suspension lead are cut.
Figure 35:
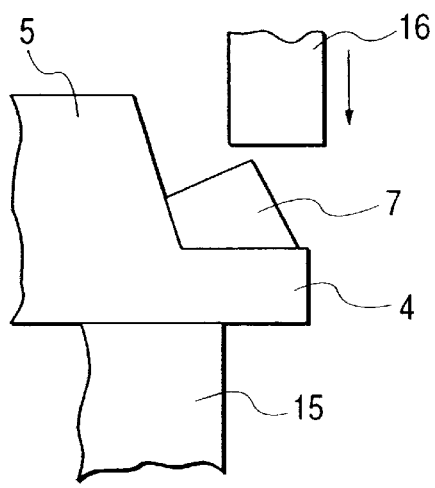
FIG. 35 is a typical view illustrating a state in which the conventional tub-suspension lead and the gate cured resin overlapping with the tub-suspension lead are cut.
Figure 38A:
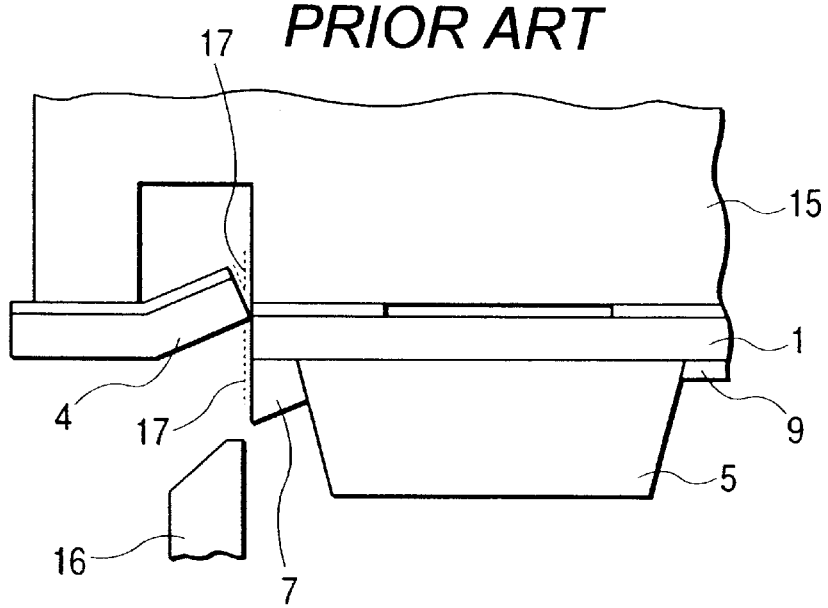
FIG. 38(a) and FIG. 38(b) are typical views illustrating the gate crush operation.
Figure 38B:
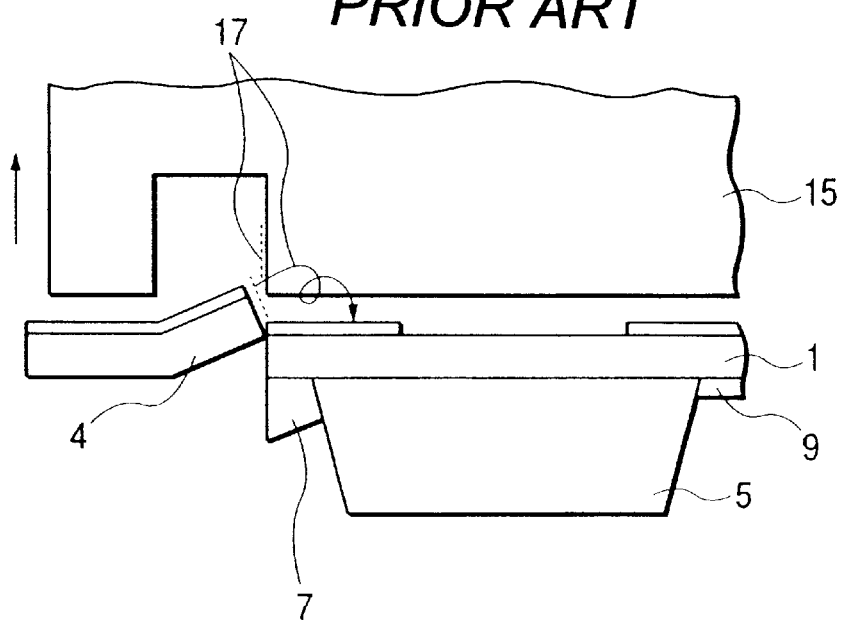

In FIG. 30(b), a gate is provided so as to cross or intersect a frame portion 2 to thereby cause its leading end to communicate with spaces defined between tub-suspension leads 4 and leads 3 and spaces defined between the adjacent leads 3. Further, air vents are respectively provided so as to intersect the frame portion 2 to thereby cause their leading ends to communicate with spaces defined between their corresponding tub-suspension leads 4 and leads 3 and spaces defined between their corresponding adjacent leads 3.

Thus, inner ends of a gate and air vents based on or related to grooves defined in a parting surface of a mold die are respectively spaced predetermined distances from edges of a cavity 40 for forming a package 5. This spacing is provided in such a manner that spacing defined by surfaces of upper and lower molds of the mold die, which are flush with the obverse and reverse sides of the leads 3 and tub-suspension leads 4, and side faces of the adjacent leads 3 or side faces of the leads 3 and tub-suspension leads 4 is used as a resin flow path.

It is possible to prevent the occurrence of resin waste and a resin crack and achieve an improvement in yield even in the case of the third embodiment in a manner similar to the first embodiment. Incidentally, the layout of the gate and the air vents is not limited to ones shown in FIG. 30.

While the invention made above by the present inventors has been described specifically by the illustrated embodiments, the present invention is not limited to the above-described embodiments. It is needless to say that various changes can be made thereto within the scope not departing from the substance thereof. For instance, the present invention can similarly be applied even to an SON wherein leads used as external electrode terminals are exposed to both sides of a mounting surface of a package, and a similar effect can be brought about. The present invention can be applied to at least the non-leaded type semiconductor device.

In the present invention, the adoption of a sheet mold method makes it possible to more suitably set an exposed shape of each electrode on the back of a package. The present sheet mold method is the technology of, when a lead frame is interposed between an upper mold and a lower mold, interposing a flexible resin sheet between the lower mold and the lead frame, and sealing each electrode portion of the lead frame in particular with a resin by means of a clamping or pinch-holding force of a die in a state in which the electrode portion has been cut into the sheet, thereby offsetting the back of the package with respect to a mounting surface of the electrode. When such a method is adopted, the back of the gate cured resin 7 is also offset from the back of each lead. Therefore, when the sheet mold method is applied to the embodiments of the present invention, the thickness of the gate cured resin might be smaller than that of the lead frame.

While the present embodiment has described the structure wherein the tub-suspension leads 4 are exposed from the corners of the package, the invention is not limited to such a type that the tub-suspension leads 4 are exposed at the package corners. The invention may be applied to, for example, a case where the tub-suspension leads 4 are not provided, and a case where the tub-suspension leads 4 are formed at portions other than the corners. In this case, the gate region or area 45 may be provided between the adjacent external electrode terminals (leads).

Advantageous effects obtained by typical ones of the inventions disclosed in the present application will be described in brief as follows:

(1) Since the occurrence of resin waste and a resin crack can be restrained when a gate cured resin and air vent cured resins employed in the manufacture of a non-leaded type semiconductor device are cut, an improvement in production yield and an improvement in the quality of a product can be achieved.

(2) Since the occurrence of resin waste and a resin crack can be restrained when a gate cured resin and air vent cured resins employed in the manufacture of a non-leaded type semiconductor device are cut, it is possible to prevent a reduction in availability factor of a cutting device or the like due to the resin waste and reduce the manufacturing cost of the semiconductor device.

What is claimed is:

1. A semiconductor device comprising:

an encapsulater including an insulating resin, a tub, first leads and tub-suspension leads exposed to a mounting surface of said encapsulater, and a gate cured resin and air vent cured resins which remain as a result of formation of said encapsulater and which protrude from said encapsulater; and a semiconductor chip sealed in said encapsulater and bonded on said tub, a plurality of said first leads being electrically connected to said semiconductor chip and said tub-suspension leads being joined to said tub;

wherein each of said gate cured resin and said air vent cured resins exists in a portion between a respective tub-suspension lead and a respective first lead with a thickness identical to or smaller than a thickness of each of resin burrs.

2. A semiconductor device comprising:

an encapsulater including an insulating resin, a tub, first leads and tub-suspension leads exposed to a mounting surface of said encapsulater, and a gate cured resin and air vent cured resins which remain as a result of formation of said encapsulater and which protrude from said encapsulater; and a semiconductor chip sealed in said encapsulater and bonded on said tub, a plurality of said first leads being electrically connected to said semiconductor chip and said tub-suspension leads being joined to said tub;

wherein said gate cured resin and said air vent cured respectively extend from edges of said encapsulater with a predetermined thickness and have obverse and reverse sides formed as flat surfaces.

3. The semiconductor device according to claim 2, wherein said gate cured resin partly overlaps with the respective tub-suspension lead.

4. The semiconductor device according to claim 2, wherein said air vent cured resins partly overlap with respective tub-suspension leads.

5. The semiconductor device according to claim 2, wherein said gate cured resin partly overlaps with at least one first lead.

6. The semiconductor device according to claim 2, wherein each of said air vent cured resins partly overlaps with at least one first lead.

* * * * *

UNITED STATES PATENT AND TRADEMARK OFFICE
CERTIFICATE OF CORRECTION

PATENT NO. : 6,664,647 B2
DATED : December 16, 2003
INVENTOR(S) : Kasuga et al.

It is certified that error appears in the above-identified patent and that said Letters Patent is hereby corrected as shown below:

<u>Title page,</u>
Item [73], Assignee, please add the following:
-- [73] Assignee: Hitachi, Ltd., Tokyo, Japan
                           Hitachi Hokkai Semiconductor, Ltd., Hokkaido, Japan --

Signed and Sealed this

Eighth Day of June, 2004

JON W. DUDAS
*Acting Director of the United States Patent and Trademark Office*